(12) United States Patent
Chung et al.

(10) Patent No.: US 12,745,422 B2
(45) Date of Patent: Sep. 22, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chia-Ling Chung, Hsinchu (TW); Chun-Chih Cheng, Changhua (TW); Ying-Liang Chuang, Hsinchu (TW); Ming-Hsi Yeh, Hsinchu (TW); Kuo-Bin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 846 days.

(21) Appl. No.: 17/809,030

(22) Filed: Jun. 27, 2022

(65) Prior Publication Data

US 2023/0420543 A1 Dec. 28, 2023

(51) Int. Cl.
*H10D 30/67* (2025.01)
*H10D 64/01* (2025.01)
(Continued)

(52) U.S. Cl.
CPC ... *H10D 30/6735* (2025.01); *H10D 64/01316* (2026.01); *H10D 64/017* (2025.01);
(Continued)

(58) Field of Classification Search
CPC ......... H01L 21/76895; H01L 21/76877; H01L 21/28079; H01L 23/5226; H10D 64/517; H10D 64/518; H10D 64/017; H10D 64/251; H10D 64/259; H10D 64/258; H10D 64/605; H10D 64/665; H10D 64/666; H10D 84/0137; H10D 84/0135; H10D 84/0149; H10D 30/014; H10D 30/43; H10D 30/62; H10D 30/6735; H10D 30/6757; H10D 30/024; H10D 30/35; H10D 30/501; H10D 30/502; H10D 30/507; H10D 30/60;
(Continued)

(56) References Cited

U.S. PATENT DOCUMENTS 6,022,800 A * 2/2000 Ho .................... H01L 21/76844
438/653
7,168,436 B2 * 1/2007 Mouri ..................... C03C 17/00
257/E21.252

(Continued)

*Primary Examiner* — Sophia T Nguyen
(74) *Attorney, Agent, or Firm* — Ingrassia Fisher & Lorenz, LLP | IF&L

(57) ABSTRACT

Disclosed is a semiconductor device and semiconductor fabrication method. A semiconductor device includes: a substrate having a metal gate, gate spacers on sides of the metal gate, an etch stop layer (ESL), and interlayer dielectric (ILD) material over a source/drain region; a tungsten (W) cap formed from W material deposited over the metal gate and between the gate spacers; and a via gate (VG) formed above the W cap. A semiconductor fabrication method includes: receiving a substrate having a metal gate, gate spacers on sides of the metal gate, an etch stop layer (ESL), and interlayer dielectric (ILD) material over a source/drain region; depositing tungsten (W) material over the substrate; removing unwanted W material to form a W cap; and forming a via gate (VG) on the W cap.

20 Claims, 19 Drawing Sheets

(51) Int. Cl.
*H10D 64/66* (2025.01)
*H10D 84/01* (2026.01)
*H10D 84/03* (2025.01)
*H10P 14/44* (2026.01)
*H10W 20/00* (2026.01)
*H10W 20/42* (2026.01)

(52) U.S. Cl.
CPC ....... *H10D 64/666* (2025.01); *H10D 84/0137* (2025.01); *H10D 84/038* (2025.01); *H10P 14/44* (2026.01); *H10W 20/056* (2026.01); *H10W 20/077* (2026.01); *H10W 20/081* (2026.01); *H10W 20/42* (2026.01)

(58) Field of Classification Search
CPC ........... H10D 30/0198; H10D 30/0212; H10D 30/0215; H10D 30/797; H10D 30/6219; H10D 30/435; H10D 64/015; H10D 64/021; H10D 84/0142
See application file for complete search history.

(56) References Cited

U.S. PATENT DOCUMENTS 7,695,570 B2* 4/2010 Mori ................ H01L 21/67028 134/36
7,896,970 B2* 3/2011 Tomita ............. H01L 21/02052 134/3
9,698,232 B2* 7/2017 Yang .................... H10D 64/666
10,164,039 B2* 12/2018 Liou .................... H10D 64/518
10,529,824 B2* 1/2020 Chiou .................. H10D 64/666
10,707,131 B2* 7/2020 Lim ..................... H10D 84/014
10,770,563 B2* 9/2020 Cheng ............... H01L 21/28194
10,861,745 B2* 12/2020 Yang ................. H01L 21/76897
11,164,789 B1* 11/2021 Ho ...................... H10D 64/017
11,164,948 B2* 11/2021 Ho .................... H10D 30/6219
11,349,007 B2* 5/2022 Cho ..................... H10D 64/018
11,742,404 B2* 8/2023 Wang ............... H01L 21/28518 257/382
12,218,213 B2* 2/2025 Tai ...................... H10D 64/518
12,252,783 B2* 3/2025 Chen ...................... C23C 16/14
12,382,701 B2* 8/2025 Huang ................. H10D 64/518
2002/0062841 A1* 5/2002 Twu .......................... B08B 3/08 134/28
2005/0250339 A1* 11/2005 Shea ................ H01L 21/32134 257/E21.018
2006/0145292 A1* 7/2006 Park .................... H01L 23/5252 257/530
2007/0190797 A1* 8/2007 Wu .................. H01L 21/02074 438/692
2013/0009310 A1* 1/2013 Sapra ............... H01L 21/32134 252/79.3
2014/0299939 A1* 10/2014 Kim ..................... H10D 84/853 257/369
2015/0311206 A1* 10/2015 Hong ..................... H10D 84/85 257/369
2017/0077256 A1* 3/2017 Adusumilli ....... H01L 21/76802
2017/0092885 A1* 3/2017 Sakuishi ................. B32B 27/30
2017/0125535 A1* 5/2017 Niimi ................... H10D 62/151
2017/0162675 A1* 6/2017 Yim ..................... H10D 30/024
2017/0186743 A1* 6/2017 Chiou ................ H10D 84/0135
2017/0207312 A1* 7/2017 Jan ................... H10D 64/01318
2018/0012806 A1* 1/2018 Li ........................ H10D 64/017
2018/0083002 A1* 3/2018 Kim .................. H01L 21/76801
2018/0175165 A1* 6/2018 Lim ..................... H10D 62/021
2018/0294191 A1 10/2018 Bao et al.
2018/0331045 A1* 11/2018 Ameele ............ H01L 21/76877
2018/0337254 A1* 11/2018 Chiou .................... H10D 30/62
2019/0088542 A1* 3/2019 Hsieh ................. H10D 30/6219
2019/0164829 A1* 5/2019 Yang .................... H10D 30/024
2019/0355620 A1* 11/2019 Freed ................ H01L 21/76819
2020/0043787 A1* 2/2020 Su ........................ H10D 84/834
2020/0044072 A1* 2/2020 Chiang .................. H10D 30/62
2020/0044073 A1 2/2020 Huang et al.
2020/0058785 A1* 2/2020 Tsai .................. H01L 21/76805
2020/0075409 A1* 3/2020 Wang .................. H01L 21/0332
2020/0098922 A1* 3/2020 You ...................... H10D 64/017
2020/0105931 A1* 4/2020 Wu ...................... H10D 62/822
2020/0126843 A1* 4/2020 Tsai ..................... H10D 30/024
2020/0126979 A1* 4/2020 Ching ................. H10D 84/038
2020/0135879 A1* 4/2020 Cheng ................. H10D 84/038
2020/0135912 A1* 4/2020 Tsai ..................... H10D 84/038
2020/0161439 A1* 5/2020 You ...................... H10D 30/024
2020/0219931 A1* 7/2020 Amanapu .............. H10B 61/00
2020/0279773 A1* 9/2020 Shusterman ......... H10D 64/258
2020/0312994 A1* 10/2020 You .................... H10D 30/6211
2020/0335595 A1* 10/2020 Huang ................. H10D 64/518
2020/0365698 A1* 11/2020 Tsai ........................ H10D 64/01
2020/0403078 A1* 12/2020 Cheng .................. H10D 84/834
2021/0043499 A1* 2/2021 Tsai .................. H01L 21/76802
2021/0043747 A1* 2/2021 Cheng ................ H10D 30/6211
2021/0057530 A1* 2/2021 Yu .................... H01L 21/76802
2021/0082756 A1* 3/2021 Tsai .................. H01L 21/76847
2021/0083046 A1* 3/2021 Lin ................... H01L 21/76897
2021/0202734 A1* 7/2021 Tsai .................. H01L 21/02362
2021/0265218 A1* 8/2021 Chuang ............... H01L 21/7682
2021/0305427 A1* 9/2021 Bae ...................... H10D 64/021
2021/0327760 A1* 10/2021 Ho ....................... H10D 64/017
2021/0343851 A1* 11/2021 Wang ................ H01L 21/28518
2021/0376111 A1* 12/2021 Chuang ................ H10D 84/038
2021/0399109 A1* 12/2021 Su ........................ H10D 62/121
2022/0037499 A1 2/2022 Chu et al.
2022/0102199 A1* 3/2022 Hsiung ............. H01L 21/76897
2022/0102204 A1* 3/2022 Hsiung .............. H10D 30/6219
2022/0102211 A1* 3/2022 Hsiung ............. H01L 21/76832
2022/0102219 A1* 3/2022 Hsiung ................ H10D 30/024
2022/0102507 A1* 3/2022 Hsiung ............. H01L 21/76829
2022/0102508 A1* 3/2022 Lee .................... H10D 30/6757
2022/0102511 A1* 3/2022 Hsiung ............... H01L 23/5226
2022/0123124 A1* 4/2022 Chiu ................. H01L 21/02603
2022/0209031 A1* 6/2022 Breus .................... H10F 71/121
2022/0223517 A1* 7/2022 Wang .................. H01L 23/5283
2022/0278108 A1* 9/2022 Yang ................. H01L 21/28556
2022/0302310 A1* 9/2022 Choi .................. H10D 30/6757
2022/0344206 A1* 10/2022 Hsiung ................ H10D 30/014
2022/0406653 A1* 12/2022 Hsiung .............. H10D 30/6219
2022/0406913 A1* 12/2022 Chen ...................... H10D 30/62
2022/0406917 A1* 12/2022 Chen .................... H10D 84/038
2023/0009144 A1* 1/2023 Lin ................... H01L 21/02271
2023/0010952 A1* 1/2023 Chen .................... H10D 62/121
2023/0038744 A1* 2/2023 Chen ....................... C23C 16/14
2023/0065056 A1* 3/2023 Lin ........................ H10D 30/62
2023/0178361 A1* 6/2023 Hung ................. H10D 84/0177 438/745
2023/0180451 A1* 6/2023 Lin .................... H10D 84/0186 257/288
2023/0223253 A1* 7/2023 Chiu .................... H10D 30/014 438/758
2023/0260832 A1* 8/2023 Lin ................... H10P 14/69391 257/751
2023/0268408 A1* 8/2023 Tai ....................... H10D 64/017 257/401
2023/0282482 A1* 9/2023 Shen ...................... H10D 30/62
2023/0395669 A1* 12/2023 Lin .................... H01L 21/32139
2024/0014292 A1* 1/2024 Lin .................... H10D 30/6211
2024/0117277 A1* 4/2024 Oie .......................... C11D 7/26
2024/0170278 A1* 5/2024 Oie ........................... C23F 1/26
2025/0364245 A1* 11/2025 Chiu .................. H10D 30/6757
2025/0366051 A1* 11/2025 Chung .............. H01L 21/28079

* cited by examiner

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
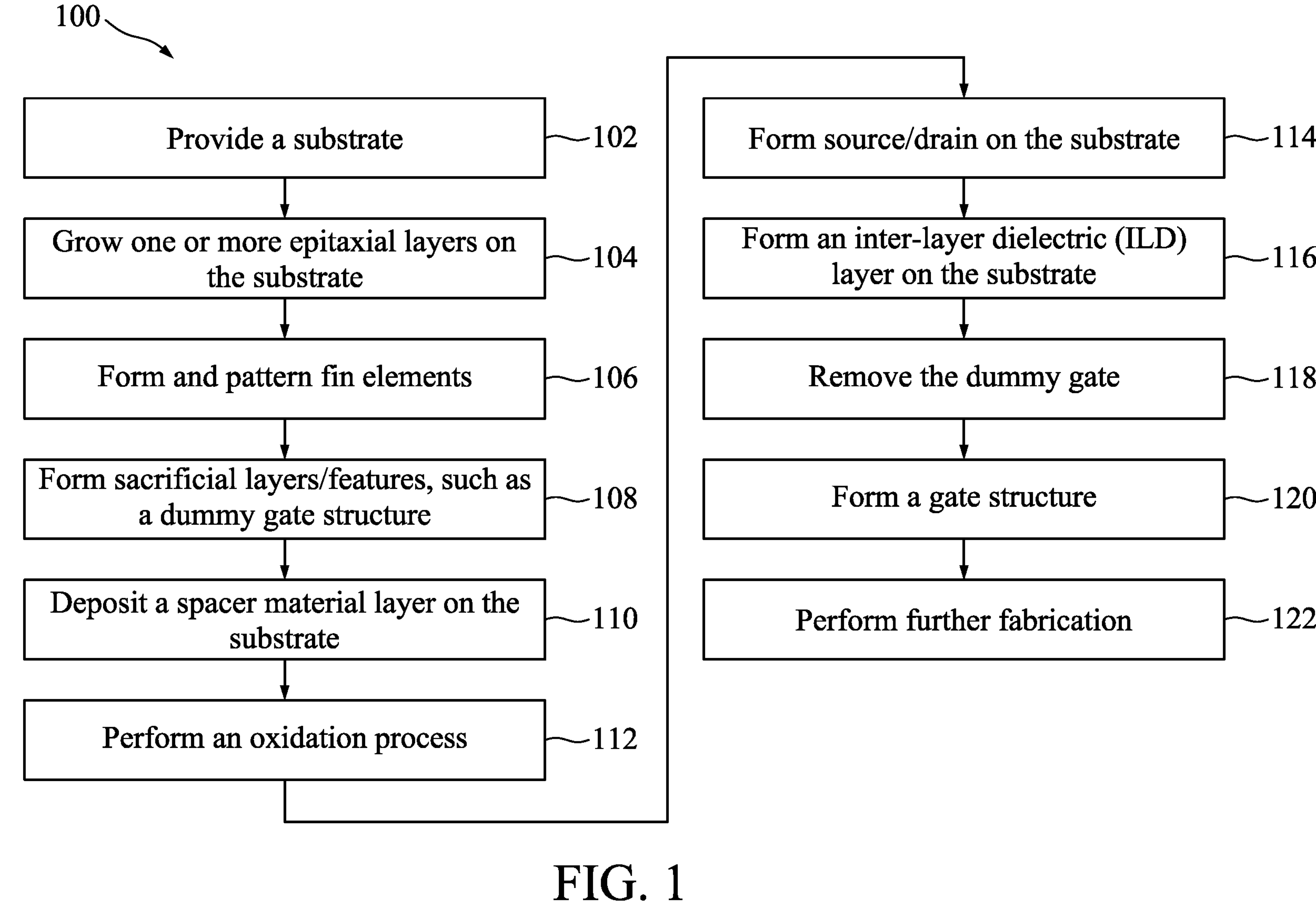
FIG. 1 is a flow chart depicting an example method of semiconductor fabrication including fabrication of multi-gate devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being “on” another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to “one embodiment,” “an embodiment,” “an example embodiment,” “exemplary,” “example,” etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) Fin- FET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

FIG. 1 is a flow chart depicting an example method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions.

FIG. 1 is described in conjunction with FIGS. 2A-2B, 3A-3B, 4A-4B, 5A-5B, 6A-6B, 7A-7B, 8A-8B, 9A-9B and 10A-10B, which illustrate a semiconductor device or structure at various stages of fabrication in accordance with some embodiments. The method 100 is merely an example and is not intended to limit the present disclosure beyond what is explicitly recited in the claims. Additional steps may be provided before, during, and after method 100, and some of these steps describe can be moved, replaced, or eliminated for additional embodiments of method 100. Additional features may be added in the semiconductor device depicted in the figures, and some of the features described below can be replaced, modified, or eliminated in other embodiments.

As with the other method embodiments and exemplary devices discussed herein, it is understood that parts of the semiconductor devices may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, dials, fuses, and or other logic devices, etc., but is simplified for better understanding of concepts of the present disclosure. In some embodiments, exemplary devices include a plurality of semiconductor devices (e.g., transistors), including PFETs, NFETs, etc., which may be interconnected. Moreover, it is noted that the process steps of method 100, include any descriptions given with reference to the figures, as with the remainder of the method and exemplary figures provided in this disclosure, are merely exemplary and are not intended to be limiting beyond what is specifically recited in the claims that follow.

FIGS. 2A, 3A, 4A, 5A, 6A, 7A, 8A, 9A and 10A, are isometric views of an example semiconductor device 200 and FIGS. 2B, 3B, 4B, 5B, 6B, 7B, 8B, 9B and 10B are corresponding cross-sectional side views of an embodiment of the example semiconductor device 200 along a first cut X-X' in an example process fabrication process in accordance with some embodiments. In some figures, some reference numbers of components or features illustrated therein may be omitted to avoid obscuring other components or features; this is for ease of depicting the figures.

At block 102, the example method 100 includes providing a substrate. Referring to the example of FIGS. 2A and 2B, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Returning to FIG. 1, the method 100 then proceeds to block 104 where one or more epitaxial layers are grown on the substrate. With reference to the example of FIGS. 2A and 2B, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layer 206 includes SiGe and where the epitaxial layer 208 includes Si, the Si oxidation rate of the epitaxial layer 208 is less than the SiGe oxidation rate of the epitaxial layer 206.

The epitaxial layers 208 or portions thereof may form a channel region of the multi-gate device 200. For example, the epitaxial layers 208 may be referred to as "nanowires" used to form a channel region of a multi-gate device 200 such as a GAA device. These "nanowires" are also used to form portions of the source/drain regions of the multi-gate device 200 as discussed below. Source/drain region(s) may refer to a source or a drain, individually or collectively dependent upon the context. Again, as the term is used herein, "nanowires" refers to semiconductor layers that are cylindrical in shape as well as other configurations such as, bar-shaped. The use of the epitaxial layers 208 to define a channel or channels of a device is further discussed below.

Figure 2B:
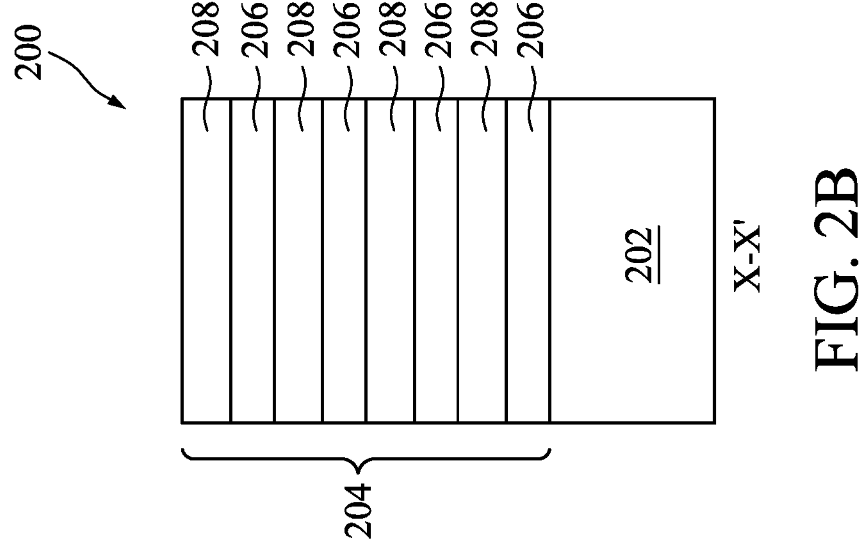
FIGS. 2B, 3B, 4B, 5B, 6B, 7B, 8B, 9B and 10B are corresponding cross-sectional side views of an embodiment of the example semiconductor device along a first cut X-X', in accordance with some embodiments.
Figure 2A:
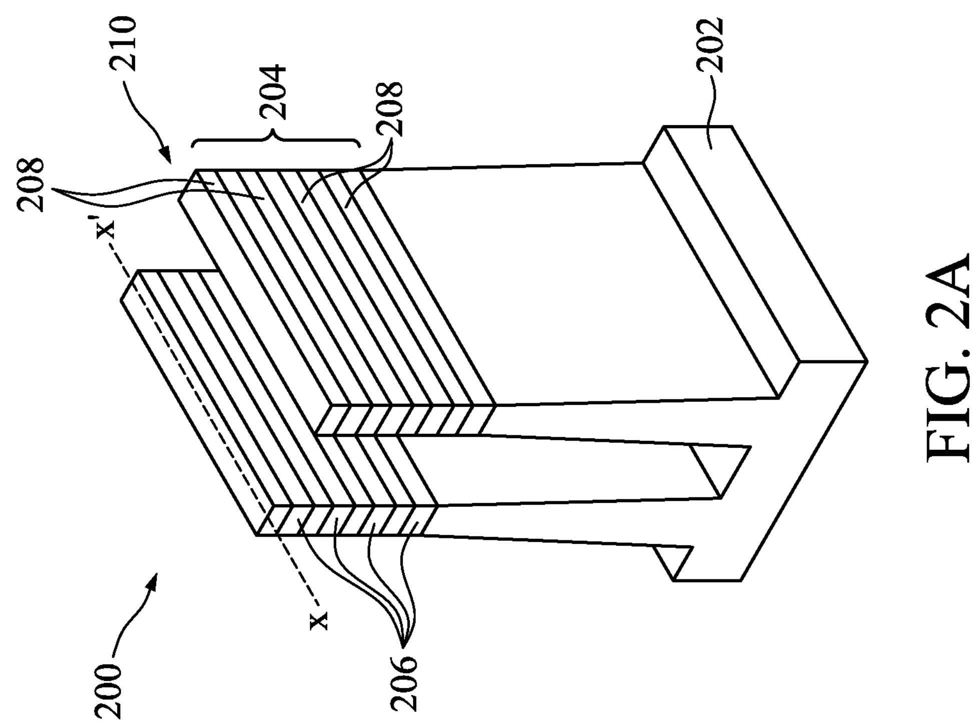
FIGS. 2A, 3A, 4A, 5A, 6A, 7A, 8A, 9A and 10A, are isometric views of an example semiconductor device, in accordance with some embodiments.

It is noted that four (4) layers of each of epitaxial layers 206 and 208 are illustrated in FIGS. 2A and 2B, this is for illustrative purposes only and not intended to be limiting beyond what is specifically recited in the claims. It can be appreciated that any number of epitaxial layers can be formed in the epitaxial stack 204; the number of layers depending on the desired number of channels regions for the device 200. In some embodiments, the number of epitaxial layers 208 is between 2 and 10.

In some embodiments, the epitaxial layer 206 has a thickness range of about 2-6 nanometers (nm). The epitaxial layers 206 may be substantially uniform in thickness. In some embodiments, the epitaxial layer 208 has a thickness range of about 6-12 nm. In some embodiments, the epitaxial layers 208 of the stack are substantially uniform in thickness. As described in more detail below, the epitaxial layer 208 may serve as channel region(s) for a subsequently-formed multi-gate device and its thickness chosen based on device performance considerations. The epitaxial layer 206 may serve to define a gap distance between adjacent channel region(s) for a subsequently-formed multi-gate device and its thickness chosen based on device performance considerations.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the layers 208 include the same material as the substrate 202. In some embodiments, the epitaxially grown layers 206, 208 include a different material than the substrate 202. As stated above, in at least some examples, the epitaxial layer 206 includes an epitaxially grown silicon germanium (SiGe) layer and the epitaxial layer 208 includes an epitaxially grown silicon (Si) layer. Alternatively, in some embodiments, either of the epitaxial layers 206, 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206, 208 may be chosen based on providing differing oxidation, etch selectivity properties. In various embodiments, the epitaxial layers 206, 208 are substantially dopant-free (i.e., having an extrinsic dopant concentration from about 0 cm−3 to about 1×1017 cm−3), where for example, no intentional doping is performed during the epitaxial growth process.

The method 100 then proceeds to block 106 where fin elements are patterned and formed. With reference to the example of FIG. 2A, in an embodiment of block 106, a plurality of fin elements 210 extending from the substrate 202 are formed. In various embodiments, each of the fin elements 210 includes a substrate portion formed from the substrate 202, portions of each of the epitaxial layers of the epitaxial stack including epitaxial layers 206 and 208.

The fin elements 210 may be fabricated using suitable processes including photolithography and etch processes. The photolithography process may include forming a photoresist layer over the substrate 202 (e.g., over the epi stack 204), exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 202, and layers 204 formed thereupon, while an etch process forms trenches in unprotected regions through masking layer(s) such as hard mask, thereby leaving the plurality of extending fins. The trenches may be etched using a dry etch (e.g., reactive ion etching), a wet etch, and/or other suitable processes. The trenches may be filled with dielectric material forming, for example, shallow trench isolation features interposing the fins.

In some embodiments, the dielectric layer may include SiO2, silicon nitride, silicon oxynitride, fluorine-doped silicate glass (FSG), a low-k dielectric, combinations thereof, and/or other suitable materials known in the art. In various examples, the dielectric layer may be deposited by a chemical vapor deposition (CVD) process, a sub atmospheric CVD (SACVD) process, a flowable CVD process, an atomic layer deposition (ALD) process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 302) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. The CMP process may planarize the top surface thereby forming STI features 302. The STI features 302 interposing the fin elements are recessed. Referring to the example of FIG. 3A, the STI features 302 are recessed providing the fins 210 extending above the STI features 302. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 210. The height 'H' exposes each of the layers of the epitaxy stack 204.

Numerous other embodiments of methods to form the fins on the substrate may also be used including, for example, defining the fin region (e.g., by mask or isolation regions) and epitaxially growing the epitaxial stack 204 in the form of the fin. In some embodiments, forming the fins may include a trim process to decrease the width of the fins. The trim process may include wet or dry etching processes.

The method 100 then proceeds to block 108 where sacrificial layers/features are formed and in particular, a dummy gate structure. While the present discussion is directed to a replacement gate process whereby a dummy gate structure is formed and subsequently replaced, other configurations may be possible.

Figure 3B:
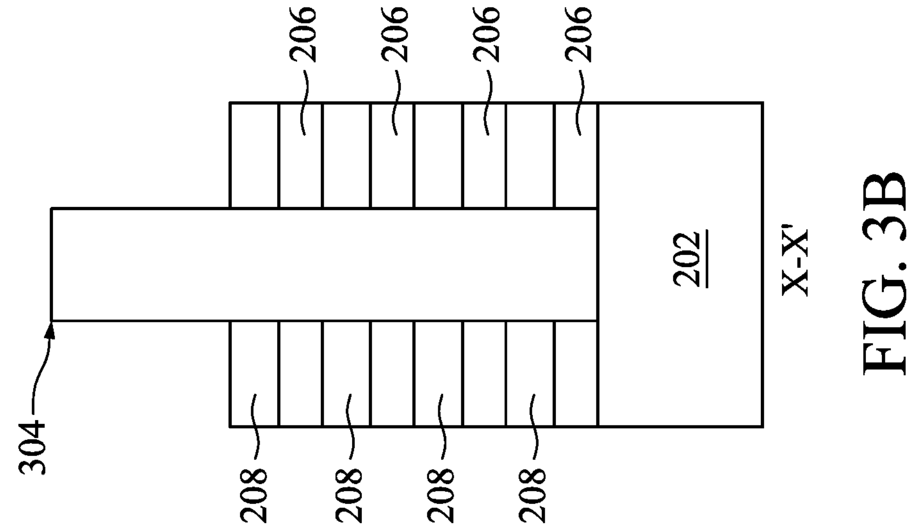
Figure 3A:
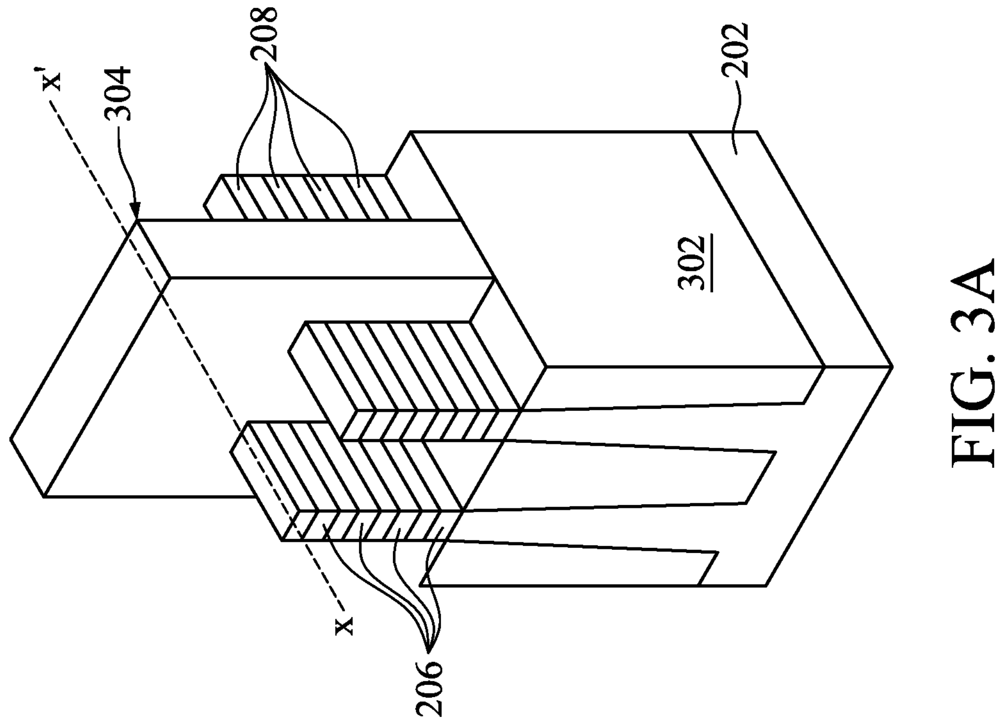

With reference to FIGS. 3A and 3B, a gate stack 304 is formed. In an embodiment, the gate stack 304 is a dummy (sacrificial) gate stack that is subsequently removed as discussed with reference to block 108 of the method 100.

Thus, in some embodiments using a gate-last process, the gate stack 304 is a dummy gate stack and will be replaced by the final gate stack at a subsequent processing stage of the device 200. In particular, the gate stack 304 may be replaced at a later processing stage by a high-K dielectric layer (HK) and metal gate electrode (MG) as discussed below. In some embodiments, the gate stack 304 is formed over the substrate 202 and is at least partially disposed over the fin elements 210. The portion of the fin elements 210 underlying the gate stack 304 may be referred to as the channel region. The gate stack 304 may also define a source/drain region of the fin elements 210, for example, the regions of the fin and epitaxial stack 204 adjacent and on opposing sides of the channel region.

In some embodiments, the gate stack 304 includes the dielectric layer and a dummy electrode layer. The gate stack 304 may also include one or more hard mask layers (e.g., oxide, nitride). In some embodiments, the gate stack 304 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the gate stack 304 may include an additional gate dielectric layer. For example, the gate stack 304 may include silicon oxide. Alternatively or additionally, the gate dielectric layer of the gate stack 304 may include silicon nitride, a high-K dielectric material or other suitable material. In some embodiments, an electrode layer of the gate stack 304 may include polycrystalline silicon (polysilicon). Hard mask layers such as $SiO_2$, $Si_3N_4$, silicon oxynitride, alternatively include silicon carbide, and/or other suitable compositions may also be included.

Figure 4B:
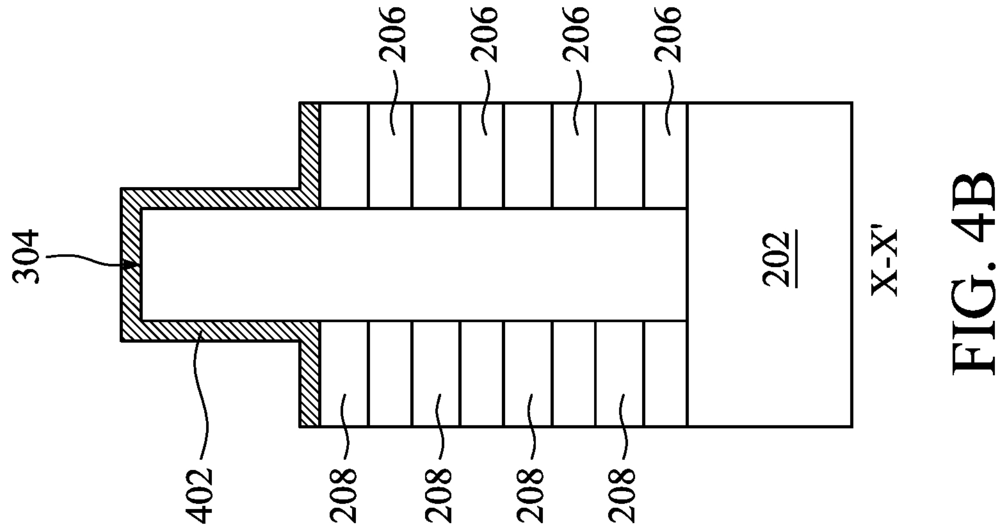
Figure 4A:
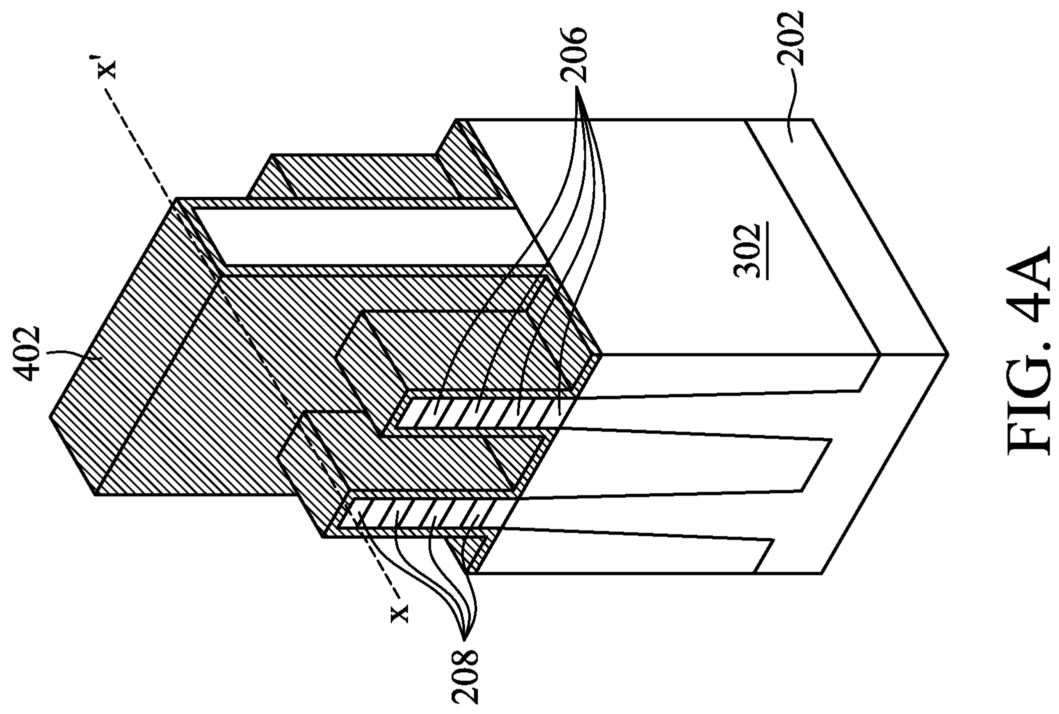

The method 100 then proceeds to block 110 where a spacer material layer is deposited on the substrate. Referring to the example of FIGS. 4A and 4B, a spacer material layer 402 is disposed on the substrate 202. The spacer layer 402 may include a dielectric material such as silicon oxide, silicon nitride, silicon carbide, silicon oxynitride, SiCN films, silicon oxycarbide, SiOCN films, and/or combinations thereof. In some embodiments, the spacer material layer 402 includes multiple layers, such as main spacer walls, liner layers, and the like. By way of example, the spacer material layer 402 may be formed by depositing a dielectric material over the gate stack 304 using processes such as, CVD process, a sub atmospheric CVD (SACVD) process, a flowable CVD process, an ALD process, a PVD process, or other suitable process. It is noted that the spacer conformal layer 402 is illustrated in FIG. 4B as covering the epitaxial stack 204.

Figure 5B:
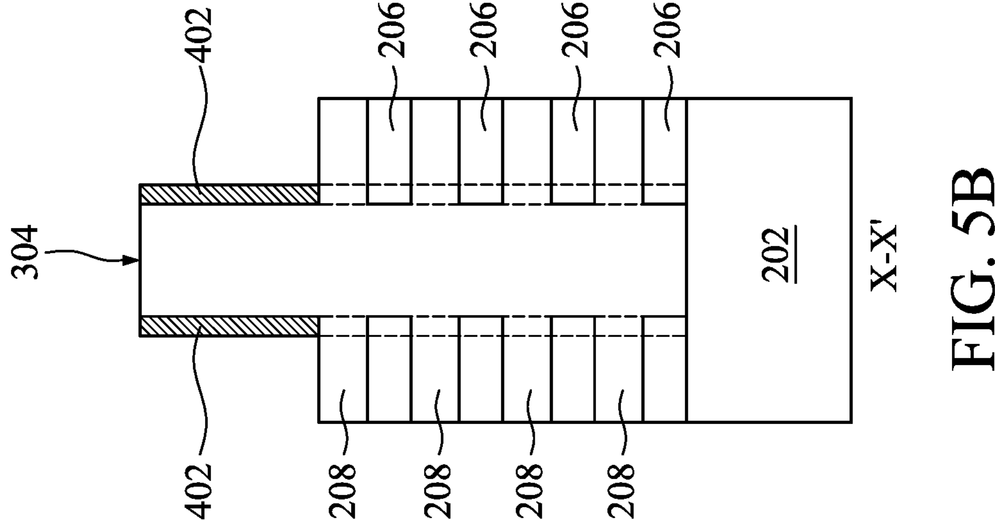
Figure 5A:
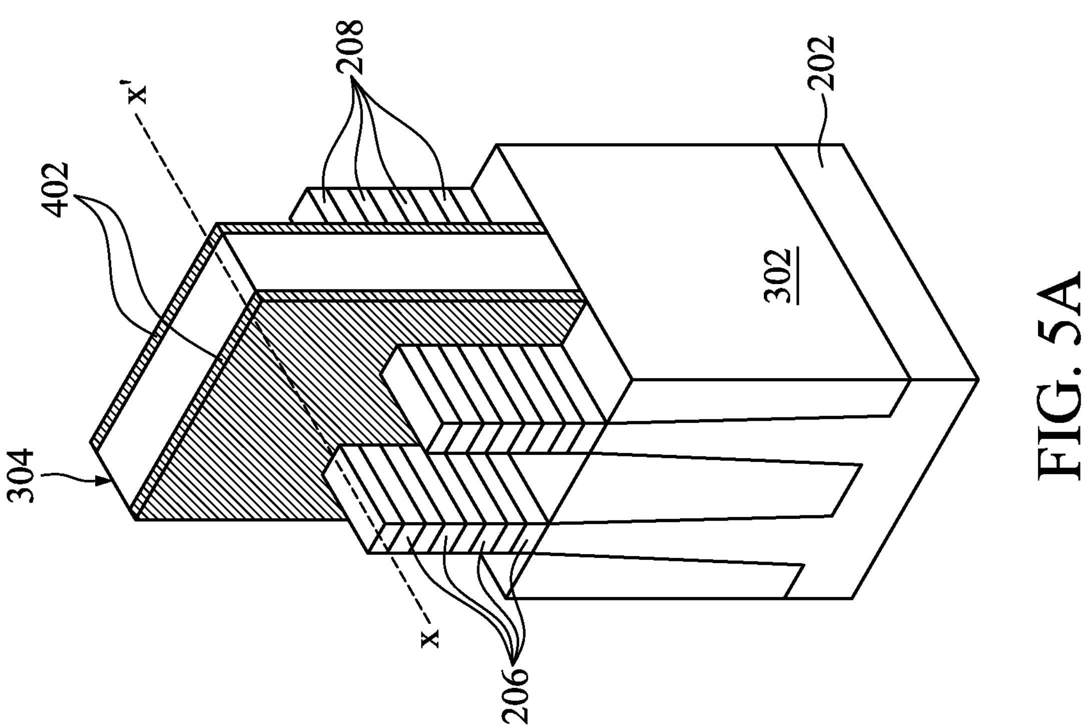

In some embodiments, the deposition of the spacer material layer is followed by an etching back (e.g., anisotropically) the dielectric spacer material. Referring to the example, with reference to the example of FIGS. 5A, 5B, after formation of the spacer material layer 402, the spacer material layer 402 may be etched-back to expose portions of the fin elements 210 adjacent to and not covered by the gate structure 304 (e.g., source/drain regions). The spacer layer material may remain on the sidewalls of the gate structure 304 forming spacer elements. In some embodiments, etching-back of the spacer layer 402 may include a wet etch process, a dry etch process, a multiple-step etch process, and/or a combination thereof. The spacer layer 402 may be removed from a top surface of the exposed epitaxial stack 204 and the lateral surfaces of the exposed epitaxial stack 204, as illustrated in FIGS. 5A and 5B.

The method 100 then proceeds to block 112 where an oxidation process is performed. The oxidation process may be referred to as a selective oxidation as due to the varying oxidation rates of the layers of the epitaxial stack 204, certain layers are oxidized. In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting. It is noted that this oxidation process may in some embodiments, extend such that the oxidized portion of the epitaxial layer(s) of the stack abuts the sidewall of the gate structure 304.

Figure 6B:
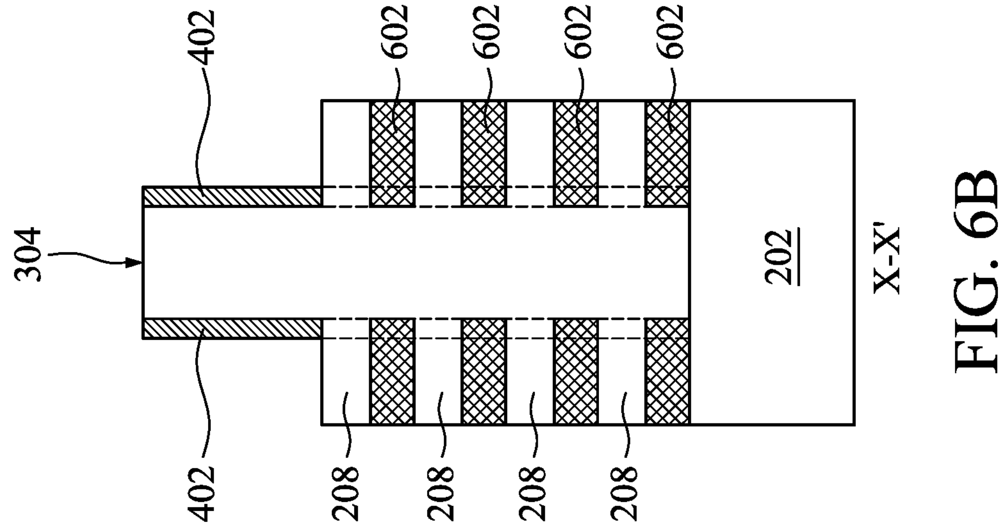
Figure 6A:
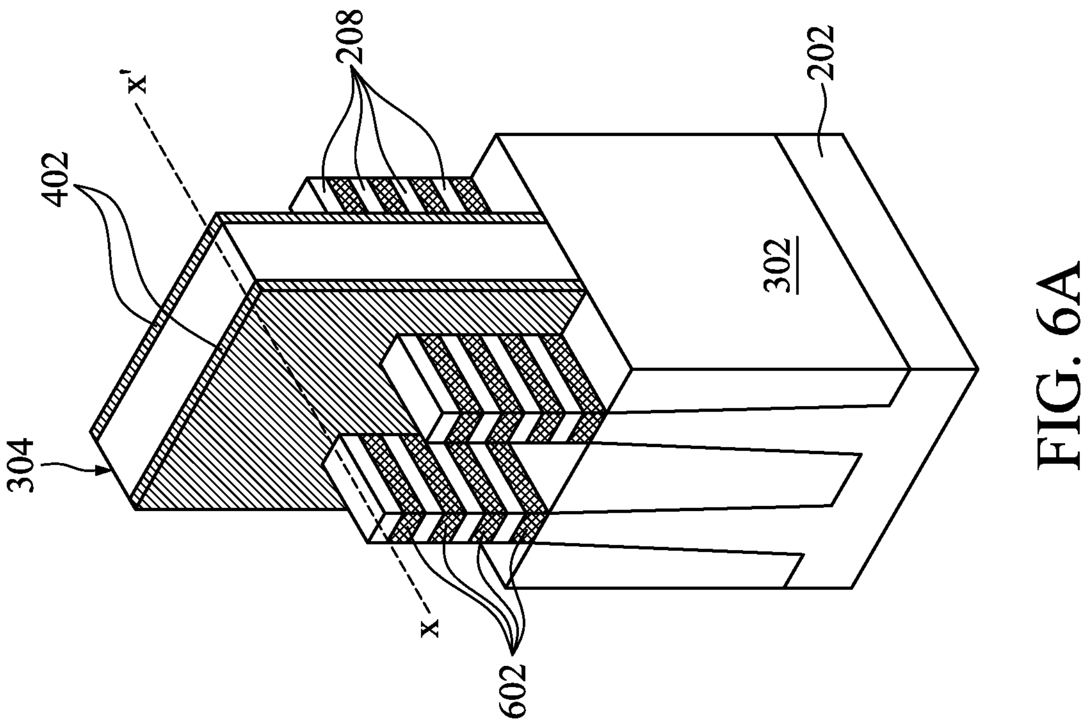
Figure 7B:
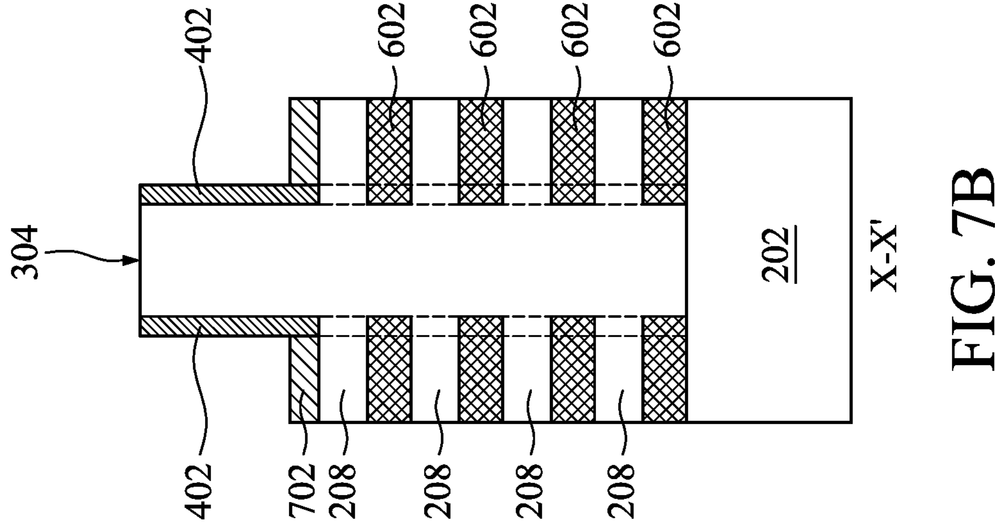
Figure 7A:
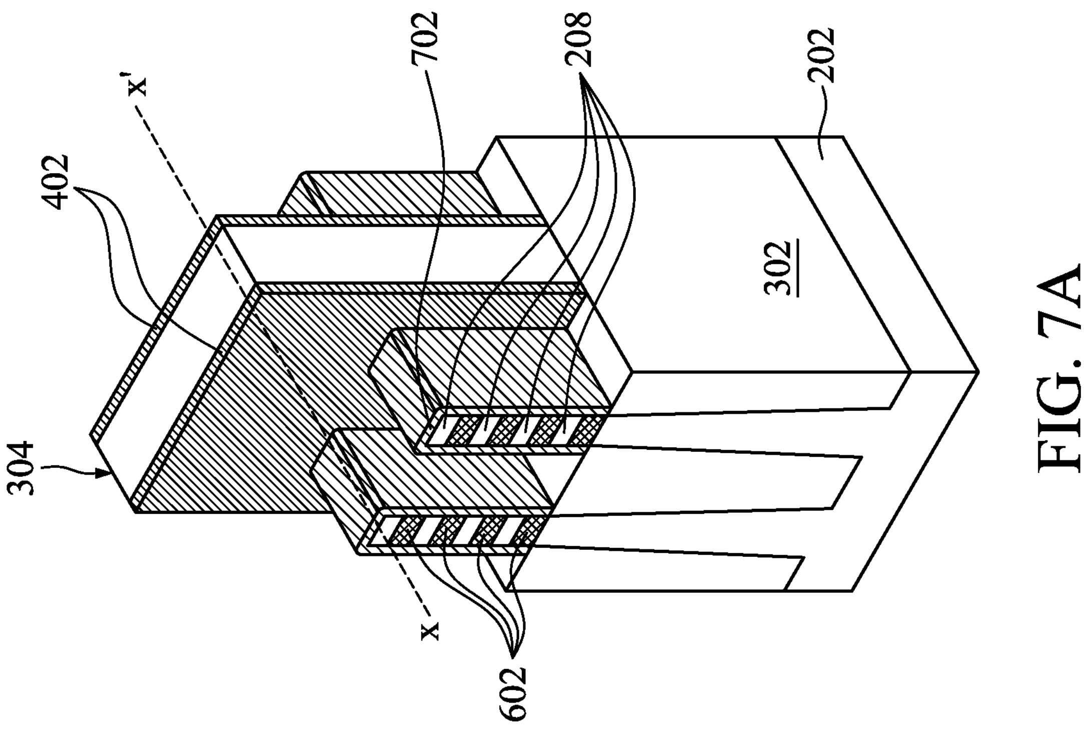
Figure 8B:
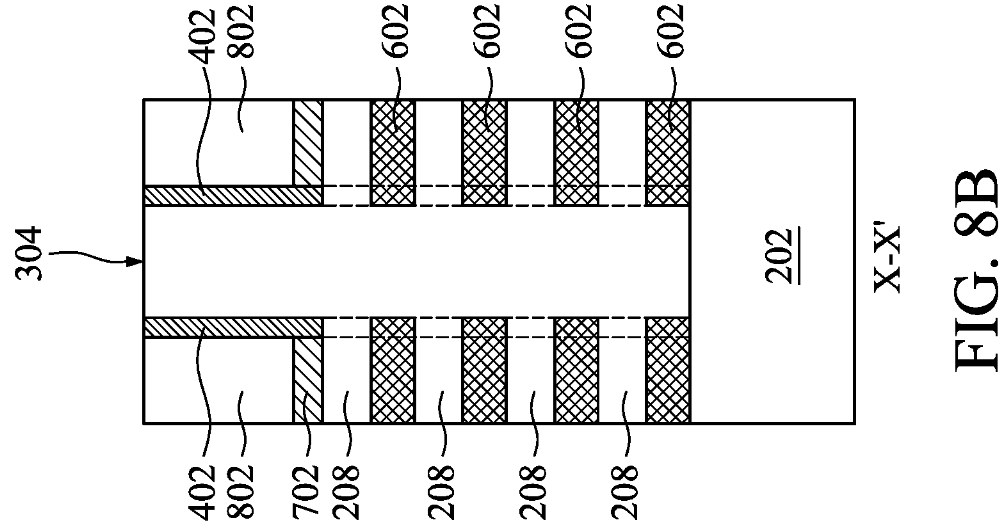
Figure 8A:
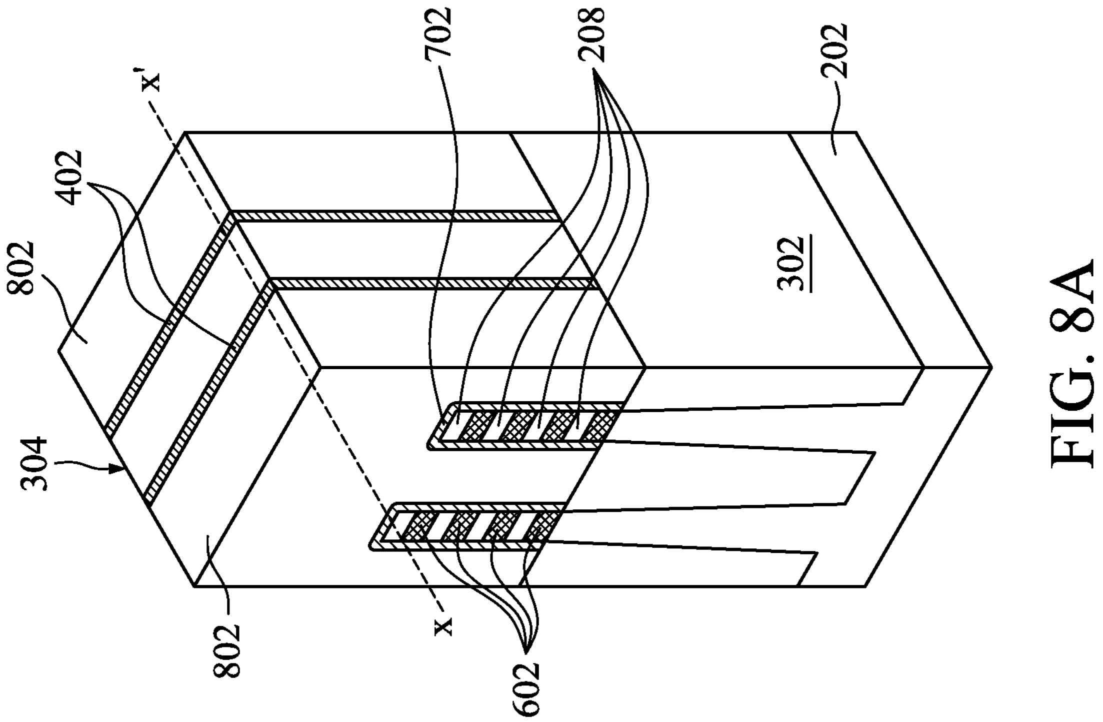
Figure 9B:
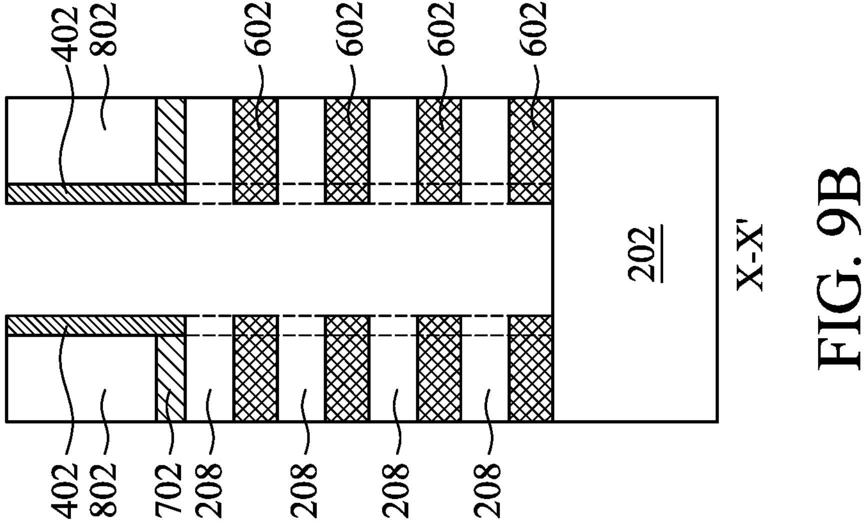
Figure 9A:
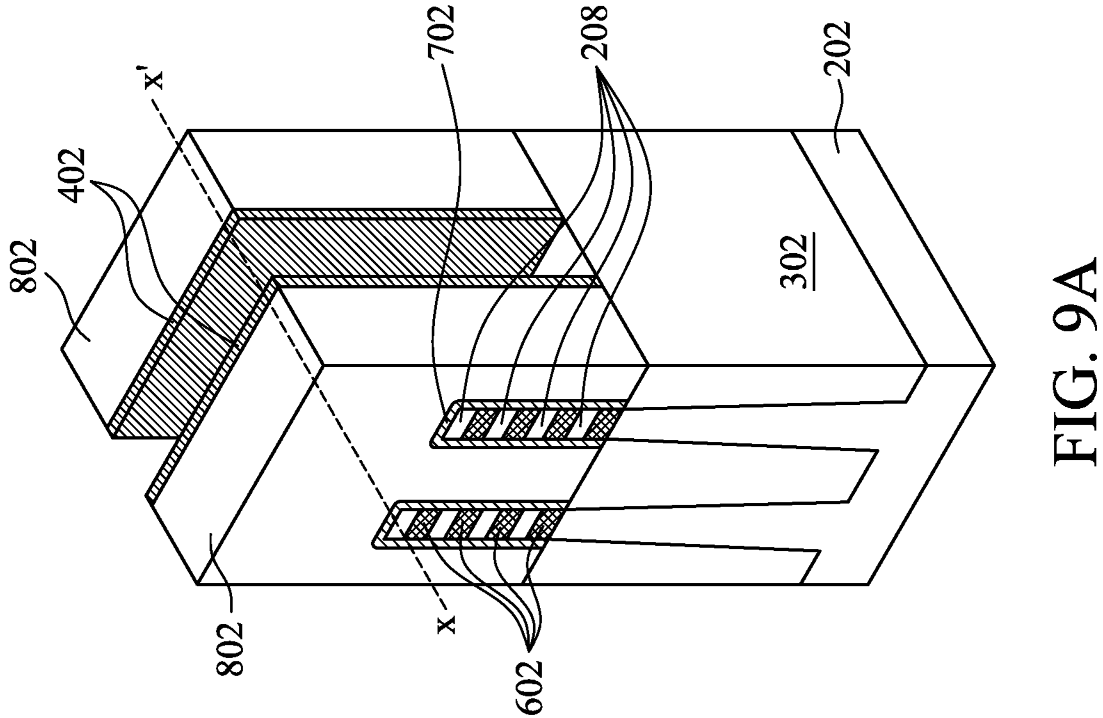

With reference to the example of FIGS. 6A and 6B, in an embodiment of block 112, the device 200 is exposed to an oxidation process that fully oxidizes the epitaxial layer 206 of each of the plurality of fin elements 210. The epitaxial layer layers 206 transform into an oxidized layer 602. The oxidized layer 602 extends to the gate structure 304, including, under the spacer elements 402. In some embodiments, the oxidized layer 602 has a thickness range of about 5 to about 25 nanometers (nm). In an embodiment, the oxidized layer 602 may include an oxide of silicon germanium (SiGeOx).

By way of example, in embodiments where the epitaxial layers 206 include SiGe, and where the epitaxial layers portion 208 includes Si, the faster SiGe oxidation rate (i.e., as compared to Si) ensures that the SiGe layer 206 becomes fully oxidized while minimizing or eliminating the oxidization of other epitaxial layers 208. It will be understood that any of the plurality of materials discussed above may be selected for each of the first and second epitaxial layer portions that provide different suitable oxidation rates.

The method 100 then proceeds to block 114 where source/drain features are formed on the substrate. The source/drain features may be formed by performing an epitaxial growth process that provides an epitaxy material on the fin 210 in the source/drain region. In an embodiment, the epitaxy material of the source/drain is formed cladding the portions of the epitaxy layers remaining in the fins' source/drain regions. Referring to the example of FIGS. 7A and 7B, source/drain features 702 are formed on the substrate 202 in/on the fin 210 adjacent to and associated with the gate stack 304. The source/drain features 702 include material formed by epitaxially growing a semiconductor material on the exposed epitaxial layer 208 and/or oxidized layer 602. It is noted that the shape of the features 702 is illustrative only and not intended to be limiting; as understood by one of ordinary skill in the art, any epitaxial growth will occur on the semiconductor material (e.g., 208) as opposed to the dielectric material (e.g., 602), the epitaxial growth may be grown such that it merges over a dielectric layer (e.g., over 602) as illustrated.

In various embodiments, the grown semiconductor material of the source/drain 702 may include Ge, Si, GaAs, AlGaAs, SiGe, GaAsP, SiP, or other suitable material. In some embodiments, the material of the source/drain 702 may be in-situ doped during the epi process. For example, in some embodiments, epitaxially grown material may be doped with boron. In some embodiments, epitaxially grown material may be doped with carbon to form Si:C source/drain features, phosphorous to form Si:P source/drain features, or both carbon and phosphorous to form SiCP source/drain features. In an embodiment, the epitaxial material of the source/drain 702 is silicon and the layer 208 also is silicon. In some embodiments, the layers 702 and 208 may comprise a similar material (e.g., Si), but be differently doped. In other embodiments, the epitaxy layer for the source/drain 702 includes a first semiconductor material, the epitaxially grown material 208 includes a second semiconductor different than the first semiconductor material. In some embodiments, the epitaxially grown material of the source/drain 702 is not in-situ doped, and, for example, instead an implantation process is performed.

The method 100 then proceeds to block 116 where an inter-layer dielectric (ILD) layer is formed on the substrate. Referring to the example of FIGS. 8A and 8B, in an embodiment of block 116, an ILD layer 802 is formed over the substrate 202. In some embodiments, a contact etch stop layer (CESL) is also formed over the substrate 202 prior to forming the ILD layer 802. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 802 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 802 may be deposited by a PECVD process or other suitable deposition technique. In some embodiments, after formation of the ILD layer 802, the semiconductor device 200 may be subject to a high thermal budget process to anneal the ILD layer.

In some examples, after depositing the ILD (and/or CESL or other dielectric layers), a planarization process may be performed to expose a top surface of the gate stack 304. For example, a planarization process includes a chemical mechanical planarization (CMP) process which removes portions of the ILD layer 802 (and CESL layer, if present) overlying the gate stack 304 and planarizes a top surface of the semiconductor device 200.

The method 100 then proceeds to block 118 where the dummy gate (see block 108) is removed. The gate electrode and/or gate dielectric may be removed by suitable etching processes. In some embodiments, block 118 also includes selective removal of the epitaxial layer(s) in the channel region of the device is provided. In embodiments, the selected epitaxial layer(s) are removed in the fin elements within the trench provided by the removal of the dummy gate electrode (e.g., the region of the fin on and over which the gate structure will be formed, or the channel region). Referring to the example of FIGS. 9A and 9B, the epitaxy layers 206 are removed from the channel region of the substrate 202 and within the trench. In some embodiments, the epitaxial layers 206 are removed by a selective wet etching process. In some embodiments, the selective wet etching includes HF. In an embodiment, the epitaxial layers 206 are SiGe and the epitaxial layers 208 are silicon allowing for the selective removal of the SiGe epitaxial layers 206.

The method 100 then proceeds to block 120 where a gate structure is formed. The gate structure may be the gate of a multi-gate transistor. The final gate structure may be a high-K/metal gate stack, however other compositions are possible. In some embodiments, the gate structure forms the gate associated with the multi-channels provided by the plurality of nanowires (now having gaps there between) in the channel region.

Figure 10B:
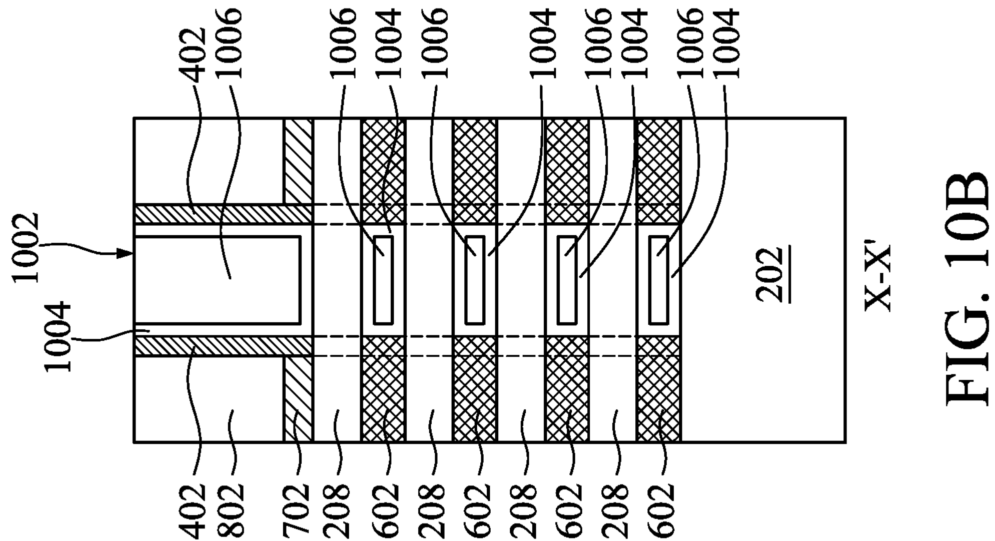
Figure 10A:
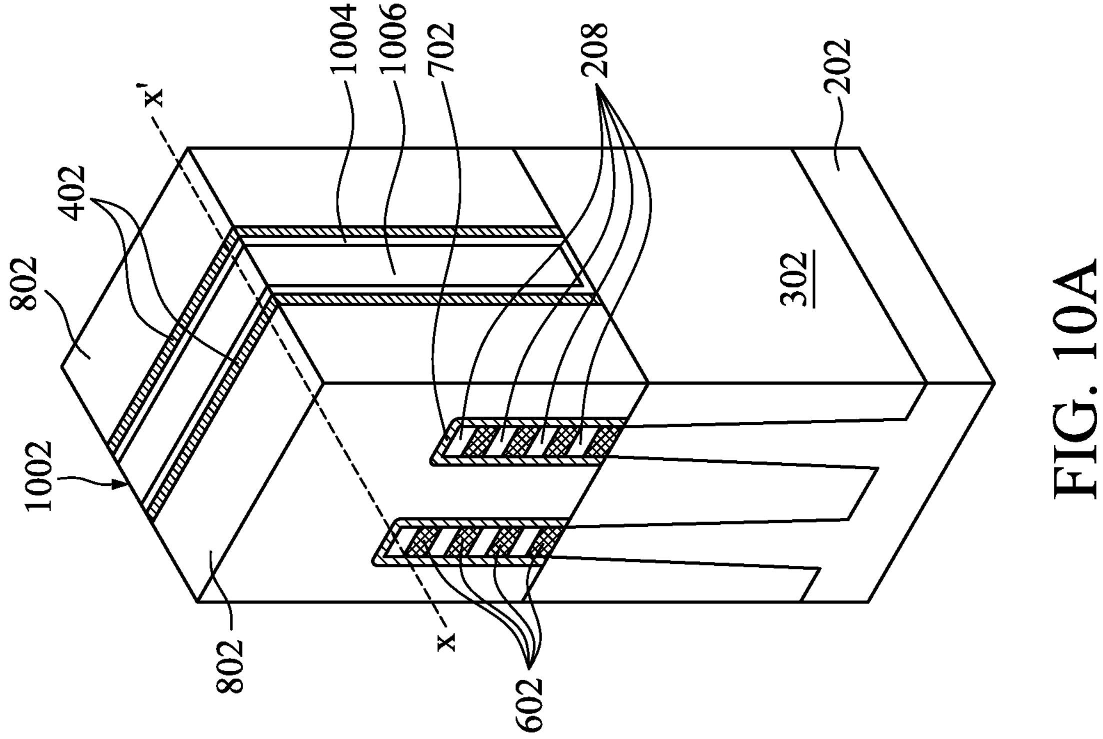

Referring to the example of FIGS. 10A and 10B, in an embodiment of block 120, a high-K/metal gate stack 1002 is formed within the trench of the device 200 provided by the removal of the dummy gate and/or release of nanowires, described above with reference to block 118. In various embodiments, the high-K/metal gate stack 1002 includes an interfacial layer, a high-K gate dielectric layer 1004 formed over the interfacial layer, and/or a metal layer 1006 formed over the high-K gate dielectric layer 1004. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack may include depositions to form various gate materials, one or more liner layers, and one or more CMP processes to remove excessive gate materials and thereby planarize a top surface of the semiconductor device 200.

In some embodiments, the interfacial layer of the gate stack 1002 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer 1004 of the gate stack 1002 may include a high-K dielectric layer such as hafnium oxide ($HfO_2$). Alternatively, the gate dielectric layer 1004 of the gate stack 1002 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1002 may be formed by ALD, physical vapor deposition (PVD), CVD, oxidation, and/or other suitable methods. The metal layer of the high-K/metal gate stack 1002 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer of gate stack 1002 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer of the gate stack 1002 may be formed by ALD, PVD, CVD, e-beam evaporation, or other suitable process. Further, the metal layer of the gate stack 1002 may be formed separately for N-FET and P-FET transistors which may use different metal layers. In various embodiments, a CMP process may be performed to remove excessive metal from the metal layer of the gate stack 1002, and thereby provide a substantially planar top surface of the metal layer of the gate stack 1002. The metal layer 1006 of the gate stack 1002 is illustrated in FIGS. 10A and 10B. In addition, the metal layer may provide an N-type or P-type work function, may serve as a transistor (e.g., FinFET) gate electrode, and in at least some embodiments, the metal layer of the gate stack 1002 may include a polysilicon layer. The gate structure 1002 includes portions that interpose each of the epitaxial layers 306, which each form channels of the multi-gate device 200.

The method 100 then proceeds to block 122 wherein further fabrication is performed. A semiconductor device may undergo further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 11:
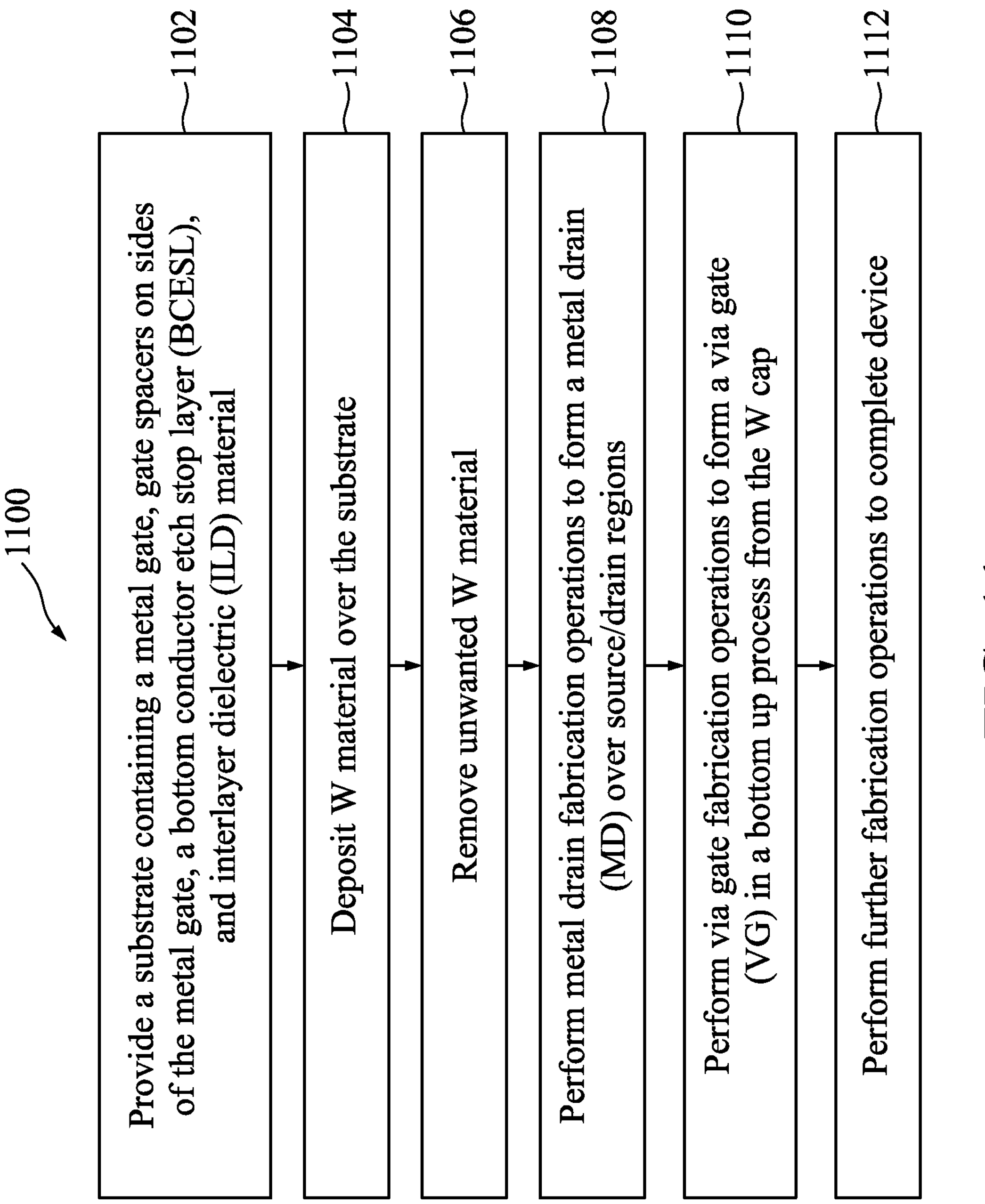
FIG. 11 is a flow chart depicting an example fabrication method for fabricating a Tungsten (W) cap for use with a subsequently fabricated via gate (VG) conductor, in accordance with some embodiments.

FIG. 11 is a flow chart depicting an example method 1100 of further semiconductor fabrication including fabrication of a metal cap for use with a subsequently fabricated via gate (VG) conductor.

FIGS. 12A-12F are diagrams depicting enlarged views of an example area 1200 (corresponding to the top portions shown in FIGS. 2B-10B) at various stages of fabricating a Tungsten (W) cap above a metal gate, in accordance with some embodiments. In some figures, some reference numbers of components or features illustrated therein may be omitted to avoid obscuring other components or features; this is for ease of depicting the figures.

Figures 12A, 12B, 12C:
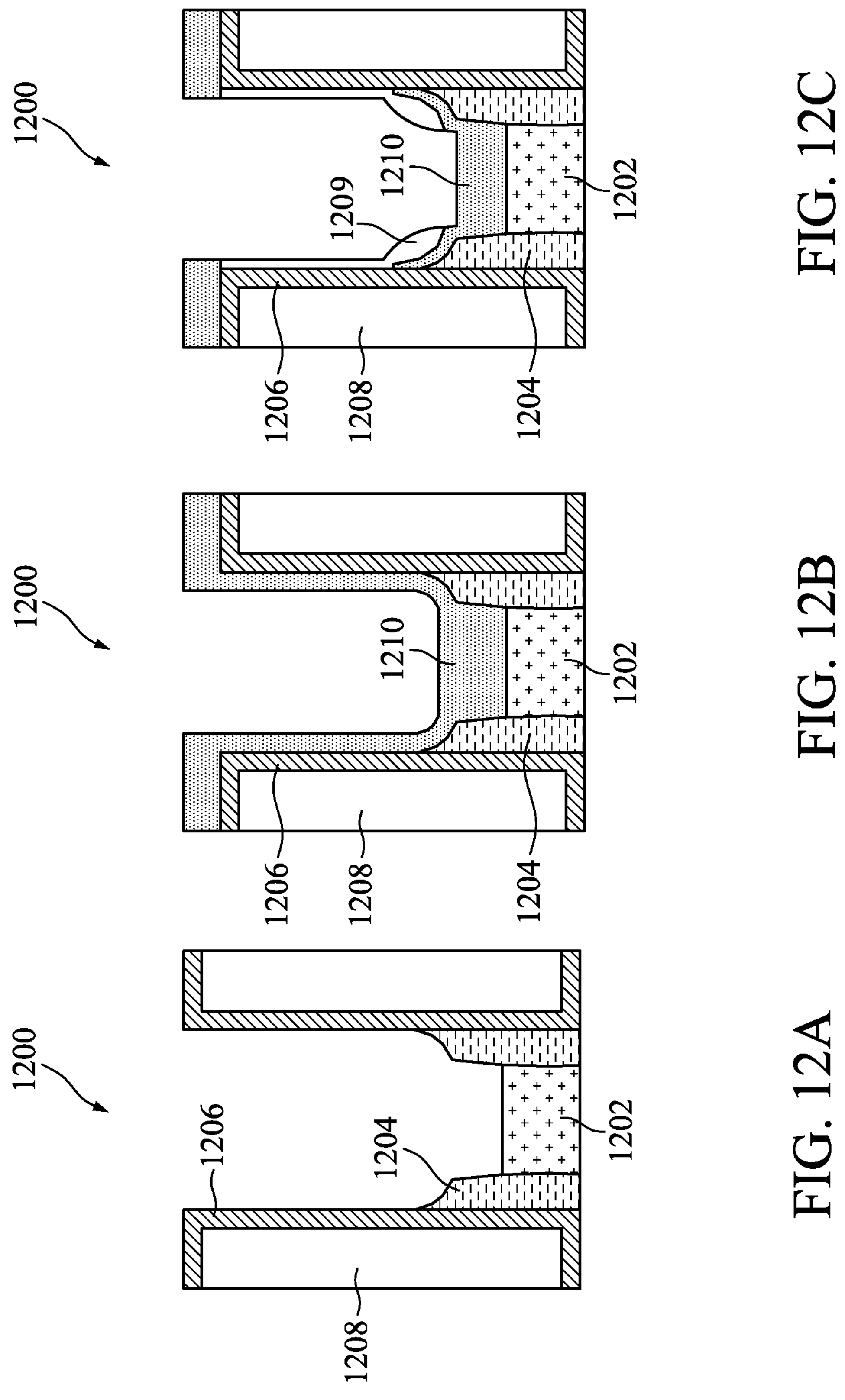
FIGS. 12A-12F are diagrams depicting enlarged views of an example semiconductor device at various stages of fabricating a Tungsten (W) cap above a metal gate, in accordance with some embodiments.

At block 1102, the example method 1100 includes providing a substrate containing a metal gate, gate spacers on sides of the metal gate, a bottom conductor etch stop layer (BCESL), and interlayer dielectric (ILD) material. FIG. 12A illustrates an example area 1200 (corresponding to the top portions shown in FIGS. 2B-10B) after metal gate formation. Depicted are a metal gate (MG) 1202 (e.g., gate stack 1002), gate spacers 1204 (e.g., spacers 402), a bottom conductor etch stop layer (BCESL) 1206, and interlayer dielectric (ILD) material 1208 (e.g., ILD 802).

It is known to use a glue layer as an interconnect material between the metal gate 1202 and a conductive plug (also known as a via gate or VG) that is subsequently fabricated to provide a connection to the MG 1202. The subject matter described herein discloses apparatus, systems, techniques, and articles for using a metal cap as an intermediary between the MG 1202 and a conductive plug instead of a glue layer. A metal cap formed of a Tungsten (W) containing composition (referred to herein as W material) can serve as an intermediary with a lower resistance than a glue layer based intermediary.

At block 1104, the example method 1100 includes depositing W material over the substrate. The W material may be deposited using a PVD process at a pressure of about 150 to about 250 mT. FIG. 12B illustrates the example area 1200 after W material deposition. As depicted, W material 1210 is deposited over the MG 1202, around sidewalls of the gate spacers 1204, along sidewalls of the BCESL 1206, and on top of the BCESL 1206.

FIG. 12C illustrates the area 1200 after W material deposition, but also illustrates that some of the deposited W may interact with the sidewalls to form tungsten oxide (WOx) 1209 on the sidewalls. In some examples, WOx formation may account for about 63-100% of the W material formed on the sidewalls, whereas WOx formation may account for about 17% of the W material formed on top of the BCESL 1206 and on top of the MG 1202.

At block 1106, the example method 1100 includes removing unwanted W material. The W material may be removed in various stages. In one stage, WOx may be removed. The WOx may be removed via wet etching operations using an ammonium solution, such as a $NH_4OH$ solution. This can result in substantially all of the WOx removed from the sidewalls of the BCESL 1206 and the sidewalls of the gate spacers 1204 with small impact on the thickness of the W material 1210 over the MG 1202. In an embodiment, wet etching operations using an ammonium solution includes using $NH_4OH$ at a concentration of 1:1 to approximately 1:50 at about 50° to about 70° C.

Figures 12D, 12E, 12F:
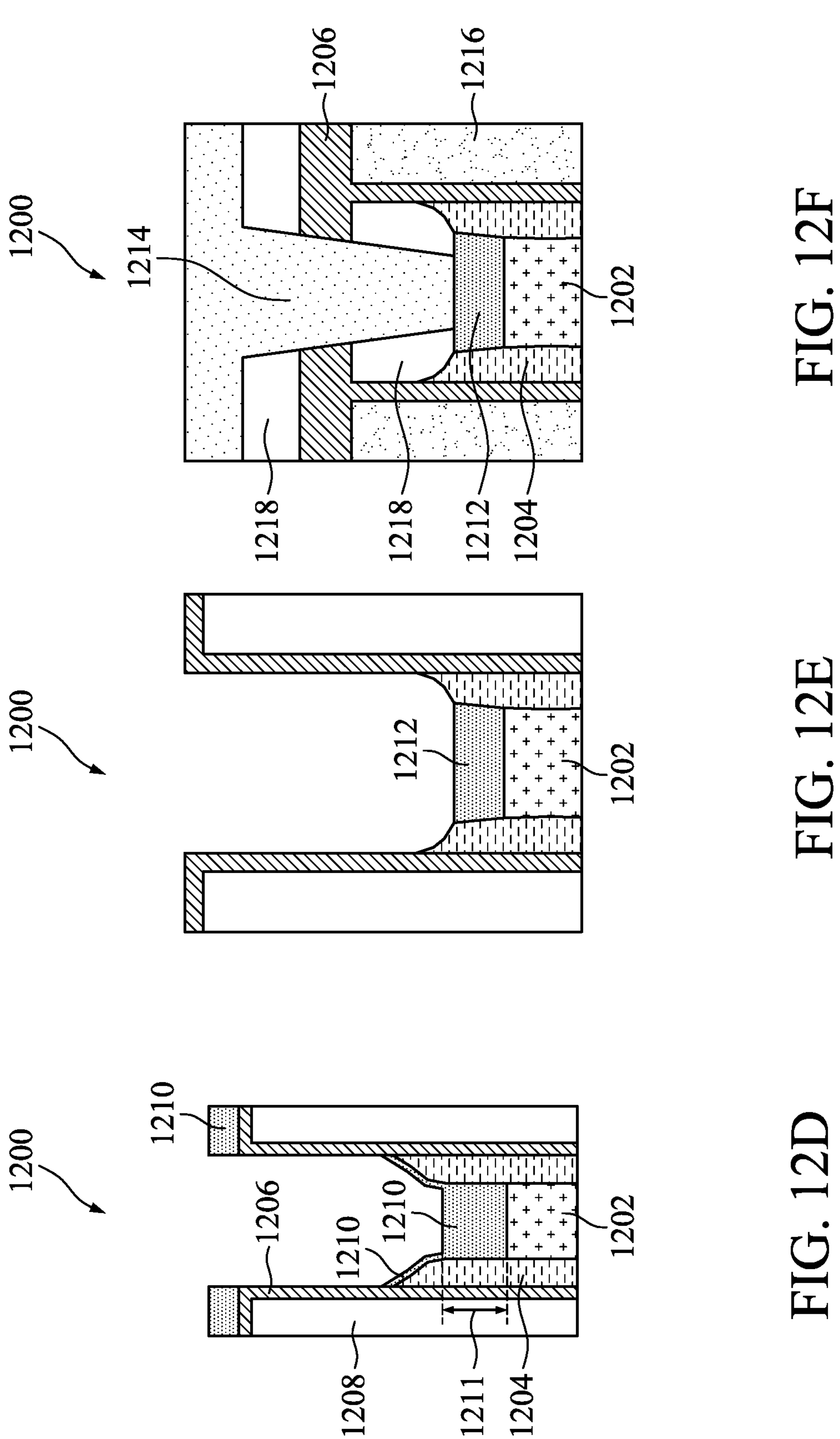

FIG. 12D illustrates the area 1200 after WOx removal from the sidewalls. In this example, W material 1210 remains on top of the BCESL 1206 and on top of the MG 1202, with substantially all (e.g., 95-100%) of the W material removed from the sidewalls of the BCESL 1206 and a substantial amount (e.g., >63%) removed from the sidewalls of the gate spacers 1204 and with small impact on the thickness 1211 of the W material 1210 over the MG 1202. This can allow for greater thickness 1211 of a W cap after further etching operations to remove the W material from the top of BCESL 1206 and the sidewalls of the gate spacers 1204.

In a second stage of removing the unwanted W material, wet etching operations using an ozone solution may be employed to remove the W material from the top of BCESL 1206 and the sidewalls of the gate spacers 1204. The W material may be removed via wet etching operations using an ozone solution, such as a $DIO_3$ solution. This can result in the W material forming a W cap that can be used as an intermediary between a subsequently formed VG and the MG. In an embodiment, wet clean operations using an ozone solution includes using $DIO_3$ at a concentration approximately 5 to 100 ppm, at room temperature.

Removing the unwanted W material may additionally or alternatively include removing the W material from the top of BCESL 1206, the sidewalls of the BCESL 1206, and the sidewalls of the gate spacers 1204 via wet etching operations using a mixture comprising an ozone component, such as a $DIO_3$ solution and hydrochloric acid (HCL).

Wet clean operations using an ozone solution alone to remove the W material from the top of BCESL 1206, the sidewalls of the BCESL 1206, and the sidewalls of the gate spacers 1204 may be insufficient in some applications to remove all of the W material from the sidewalls of the BCESL 1206 and the sidewalls of the gate spacers 1204—a W material residue may remain, which could potentially create a short risk between the MG and a subsequently formed source/drain contact (referred to herein as MD).

Wet clean operations using an ozone solution alone to remove the W material from the top of BCESL 1206, the sidewalls of the BCESL 1206, and the sidewalls of the gate spacers 1204 may alternatively result in too much of the W material from the top of the MG 1202 being removed to eliminate the W material on the sidewalls thus thwarting some of the advantages (e.g., lower resistance) of a W cap as an intermediary versus using a glue layer as an intermediary.

Wet clean operations with a solution containing both an ozone solution and HCL can result in removal of the W material from the top of BCESL 1206, the sidewalls of the BCESL 1206, and the sidewalls of the gate spacers 1204 without too much removal of the W material from the top of the MG 1202. The HCl can be more effective at removing the W material that intermixed with BCESL 1206 than the ozone solution alone resulting in reduced etching time and reduced etching of the W material from the top of the MG 1202. This can allow for greater thickness 1211 of a W cap.

In an embodiment, wet clean operations using a solution comprising ozone and hydrochloric acid mixed in water ($DIO_3$+hydrochloric acid (HCl)) to create a W cap on the MG is used. This mixture reduces the possibility formation of a residue antenna extending above the gate spacer which if present could create a short risk to a subsequently formed MD. In an example, the solution includes $DIO_3$ with a concentration of 5 to 100 ppm at room temperature and HCl with a concentration of 1:1 to approximately 1:50 at about 25° to about 50° C. The W cap is formed with a thickness in the range of 2 to about 10 nm without residue above the gate spacer.

FIG. 12E illustrates the area 1200 after formation of a W cap 1212 that can be used as an intermediary between a subsequently formed VG and the MG 1202. The W cap 1212 may be formed using various combinations of (a) via wet etching operations using an ammonium chemical, such as a $NH_4OH$ solution; (b) wet etching operations using ozone (e.g., $DIO_3$); and/or (c) wet etching operations using a solution comprising ozone and hydrochloric acid mixed in water ($DIO_3$+hydrochloric acid (HCl)). The W cap 1212 may be formed with a thickness in the range of 2 to about 10 nm without residue above the gate spacer.

The example method 1100, at block 1108, includes performing metal drain fabrication operations to form a metal drain (MD) over source/drain regions and, at block 1110, includes performing via gate fabrication operations to form a via gate (VG) in a bottom up process from the W cap 1212. The W cap 1212 can provide an interconnect between the MG 1202 and the VG 1214 with a lower resistance than would be achieved using a glue layer as an interconnect.

Metal drain fabrication operations (block 1108) may include forming a patterned mask over the area 1200 and exposing a portion of the ILD layer 1208. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Metal drain fabrication operations (block 1108) may further include removing the exposed portion of the ILD layer 1208 to form an opening that exposes an underlying source/drain structure. The exposed portion of the ILD layer 1208 can be removed by suitable etching process, such as wet etching, dry etching, or combination thereof. During etching the ILD layer 1208, the etchant is selected to provide etching selectivity between ILD layer 1208 and other structures, such as the gate spacers 1204 and the W cap 1212. For example, ILD layer 1208 has lower etching resistance to the etchant than the gate spacers 1204 and the W cap 1212, such that the ILD layer 1208 can be etched while keeping the gate spacers 1204 and the W cap 1212 substantially intact.

Metal drain fabrication operations (block 1108) may further include removing the patterned mask and forming a source/drain contact 1216 in the opening. Forming a source/drain contact 1216 in the opening may include filling a conductive material in the openings contacting the source/drain regions to form source/drain contact 1216. The source/drain contact 1216 may comprise one or more layers. For example, in some embodiments, the source/drain contact 1216 comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact 1216 in the opening.

Via gate fabrication operations (block 1110) may include forming an opening through interlayer dielectric (ILD) material to contact the W cap 1212. The opening for the Via gate fabrication operations may be formed using acceptable photolithography and etching techniques. The via gate can be deposited by CVD, ALD, electroless deposition (ELD), PVD, electroplating, or another deposition technique.

FIG. 12F illustrates the area 1200 after formation of a VG 1214. Depicted are the MG 1202, gate spacers 1204, a bottom conductor etch stop layer (BCESL) 1206, the VG 1214, metal source/drain (MD) conductors 1216, and interlayer dielectric (ILD) material 1218. The VG 1214 may be or comprise tungsten, cobalt, copper, ruthenium, aluminum, gold, silver, alloys thereof, the like, or a combination thereof. The MD 1216 may be copper, a copper alloy, silver, gold, tungsten, cobalt, aluminum, ruthenium, nickel, or the like. The ILD 1218 is a low k material such as an oxide.

The example method 1100 includes, at block 1112, performing further fabrication operations. A semiconductor device may undergo further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1100, and some process steps described above may be replaced or eliminated in accordance with various embodiments of the method 1100.

Figure 13:
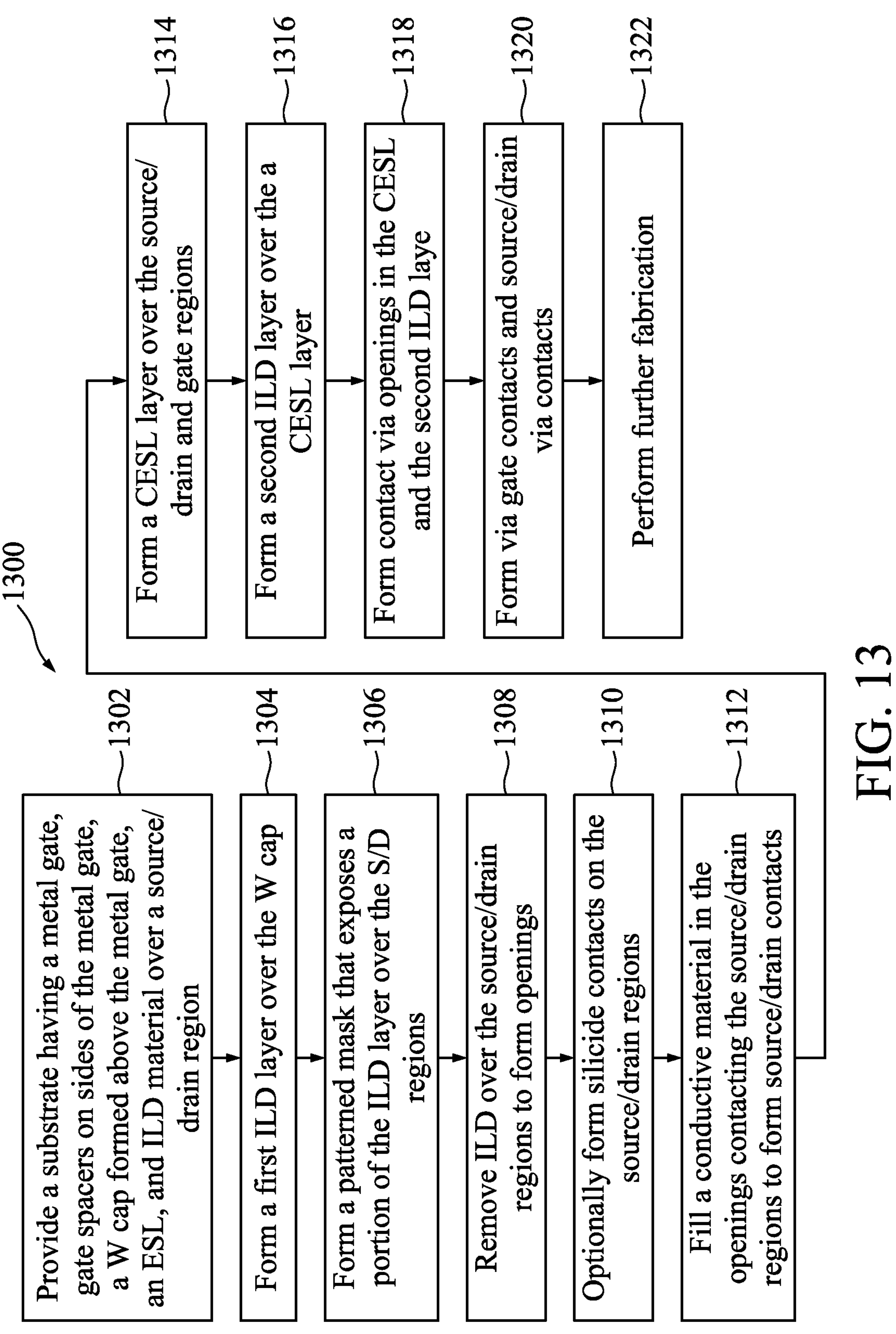
FIG. 13 process flow chart depicting an example method of further semiconductor fabrication including metal drain fabrication and via gate fabrication, in accordance with some embodiments.

FIG. 13 is a process flow chart depicting an example method 1300 of further semiconductor fabrication including metal drain fabrication and via gate fabrication, in accordance with some embodiments. The method 1300 is merely an example and is not intended to limit the present disclosure beyond what is explicitly recited in the claims. Additional steps may be provided before, during, and after method 1300, and some of the steps described can be moved, replaced, or eliminated for additional embodiments of method 1300. Additional features may be added in the integrated circuit depicted in the figures, and some of the features described below can be replaced, modified, or eliminated in other embodiments.

FIG. 13 illustrates example operations that may be performed between block 1108 and block 1110 of FIG. 11, in accordance with some embodiments. FIG. 13 is described in conjunction with FIGS. 14A-14E, wherein FIGS. 14A-14E are diagrams depicting expanded views of an example area 1400 (corresponding to areas shown in FIGS. 12E-12F) at various stages of semiconductor fabricating including metal drain fabrication and via gate fabrication, in accordance with some embodiments. In some figures, some reference numbers of components or features illustrated therein may be omitted to avoid obscuring other components or features; this is for ease of depicting the figures.

At block 1302, the example method 1300 includes providing a substrate having a metal gate, gate spacers on sides of the metal gate, a W cap formed above the metal gate, an etch stop layer (ESL), and interlayer dielectric (ILD) material over a source/drain region.

At block 1304, the example method 1300 includes forming a first ILD layer over the W cap. The first ILD layer may include or be a material such as silicon nitride (SiN), although other suitable materials, such as silicon oxide ($SiO_2$), aluminum oxide (AlO), silicon oxycarbide (SiOC), silicon carbon (SiC), zirconium nitride (ZrN), zirconium oxide (ZrO), combinations of these, or the like, may also be utilized. The first ILD layer may be deposited using a deposition process such as plasma enhanced atomic layer deposition (PEALD), thermal atomic layer deposition (thermal ALD), plasma enhanced chemical vapor deposition (PECVD), or others. Any suitable deposition process and process conditions may be utilized.

At block 1306, the example method 1300 includes forming a patterned mask that exposes a portion of the ILD material over the source/drain regions. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Figure 14A:
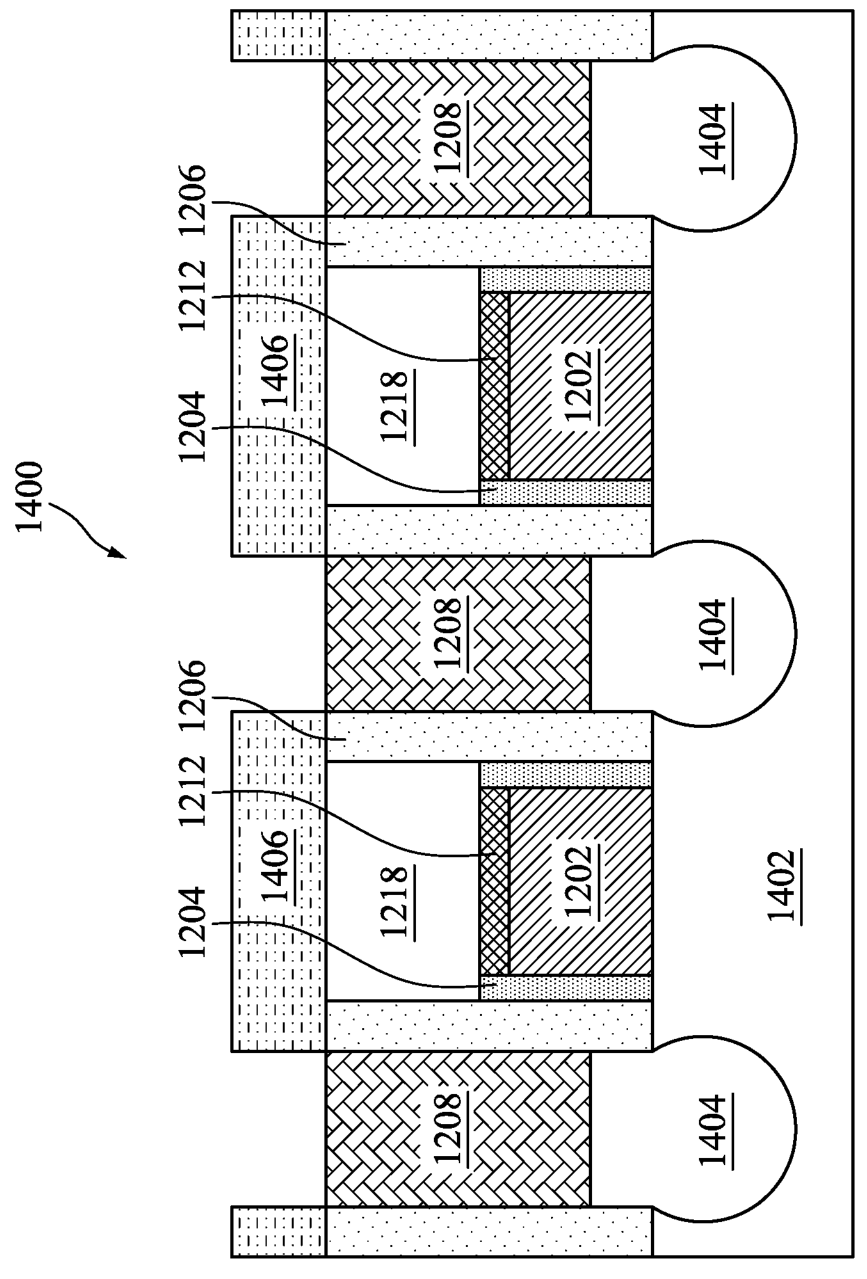
FIGS. 14A-14E are diagrams depicting expanded views of an example area of an example semiconductor device at various stages of semiconductor fabricating including metal drain fabrication and via gate fabrication, in accordance with some embodiments.

Referring to the example of FIG. 14A, in an embodiment after completion of blocks 1302, 1304, and 1306, an area 1400 including a substrate 1402 having a metal gate 1202, gate spacers 1204 on sides of the metal gate 1202, a W cap 1212 formed above the metal gate 1202, an ESL 1206, ILD material 1208 over a source/drain region 1404, a first ILD layer 1218 over the W cap 1212, and a patterned mask 1406 that exposes a portion of the ILD material 1208 over the source/drain regions 1404 is illustrated.

At block 1308, the example method 1300 includes removing ILD material over the source/drain regions to form openings that expose the underlying source/drain regions. The exposed portion of the ILD materail can be removed by suitable etching process, such as wet etching, dry etching, or combination thereof.

At block 1310, the example method 1300 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions.

Figure 14B:
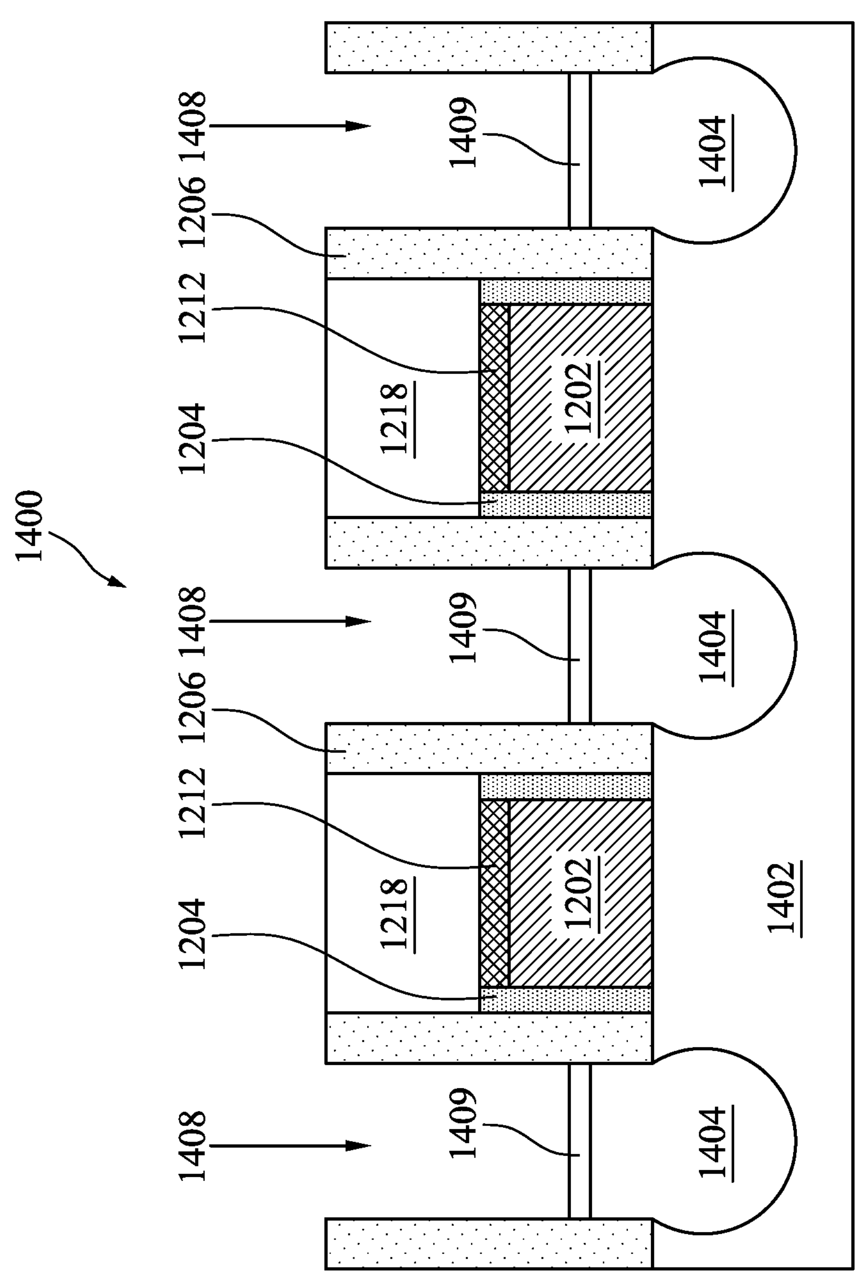

Referring to the example of FIG. 14B, in an embodiment after completion of blocks 1308 and 1310, the area 1400 includes openings 1408 that expose underlying source/drain regions 1404 and optionally formed silicide contacts 1409 on the source/drain regions 1404 that have been exposed. The figure depicts that the ILD material 1208 over the source/drain regions 1404 has been removed to form the openings 1408 that expose underlying source/drain regions 1404.

At block 1312, the example method 1300 includes filling a conductive material in the openings contacting the source/drain regions to form source/drain contacts. The source/drain contact 1216 may comprise one or more layers. For example, in some embodiments, the source/drain contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening.

Figure 14C:
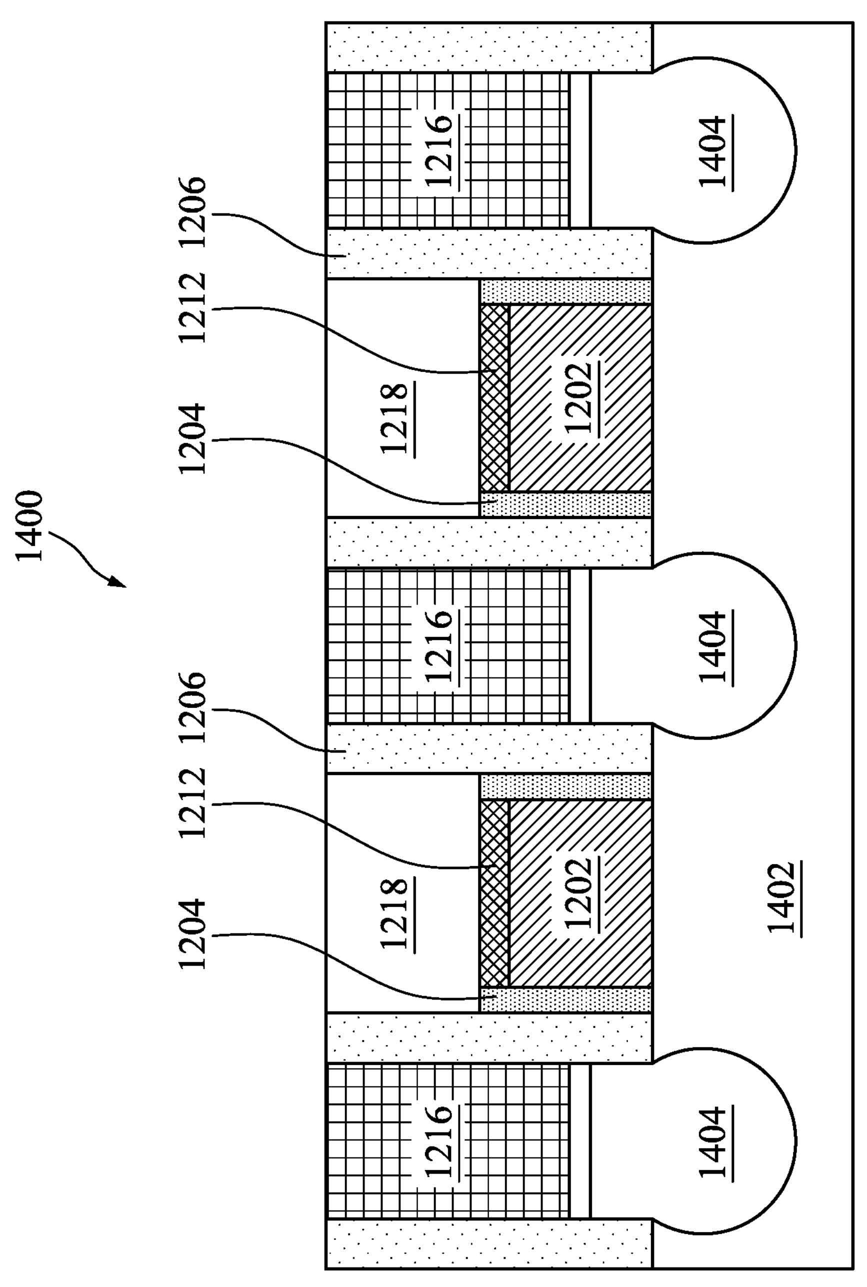

Referring to the example of FIG. 14C, in an embodiment after completion of block 1312, the area 1400 includes a conductive material filling the openings 1408 and contacting the source/drain regions 1404 to form source/drain contacts 1216.

At block 1314, the example method 1300 includes forming a contact etch stop layer (CESL) layer over the source/drain and gate regions. The CESL may be deposited using one or more low temperature deposition processes such as chemical vapor deposition, physical vapor deposition, or atomic layer deposition.

At block 1316, the example method 1300 includes forming a second ILD layer over the a CESL layer. The second ILD layer may be formed of a dielectric material such as oxides (e.g., silicon oxide (SiO2)) and may be deposited over the CESL by any acceptable process (e.g., CVD, PEALD, thermal ALD, PECVD, or the like). The second ILD layer may also be formed of other suitable insulation materials (e.g., PSG, BSG, BPSG, USG, or the like) deposited by any suitable method (e.g., CVD, PECVD, flowable CVD, or the like). After formation, the second ILD layer may be cured, such as by an ultraviolet curing process.

Figure 14D:
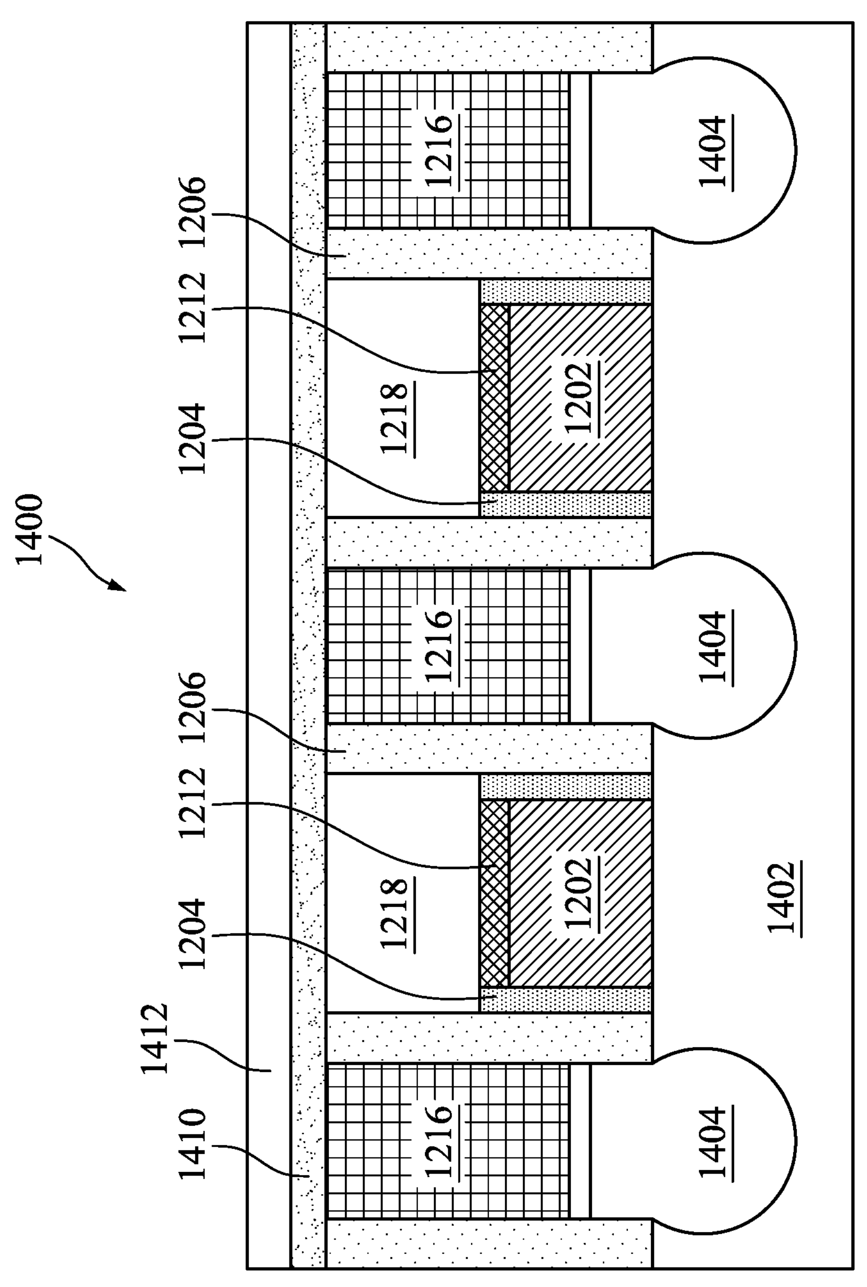

Referring to the example of FIG. 14D, in an embodiment after completion of blocks 1314 and 1316, the area 1400 includes a CESL layer 1410 formed over the source/drain and gate regions and a second ILD layer 1412 formed over the CESL layer 1410.

At block 1318, the example method 1300 includes forming contact via openings in the CESL and the second ILD layer for gate via contacts and for source/drain via contacts. Contact via openings for the gate via contact and the source/drain via contact are formed through using one or more etching processes. According to some embodiments, openings for the gate via contact are formed through the second ILD layer, the CESL, and the first ILD layer and openings for the source/drain via contact are formed through the second ILD layer and the CESL. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact via openings.

At block 1320, the example method 1300 includes forming via gate contacts and source/drain via contacts. The gate via contact is formed over and electrically coupled to the W cap and the source/drain via contact is formed over and electrically coupled to source/drain contacts. The via gate contacts and/or the source/drain via contacts can be formed by depositing metal material in the opening. The metal material may be deposited by CVD, ALD, electroless deposition (ELD), PVD, electroplating, or another deposition technique. The via gate contacts and/or the source/drain via contacts may be or comprise tungsten, cobalt, copper, ruthenium, aluminum, gold, silver, alloys thereof, the like, or a combination thereof.

Figure 14E:
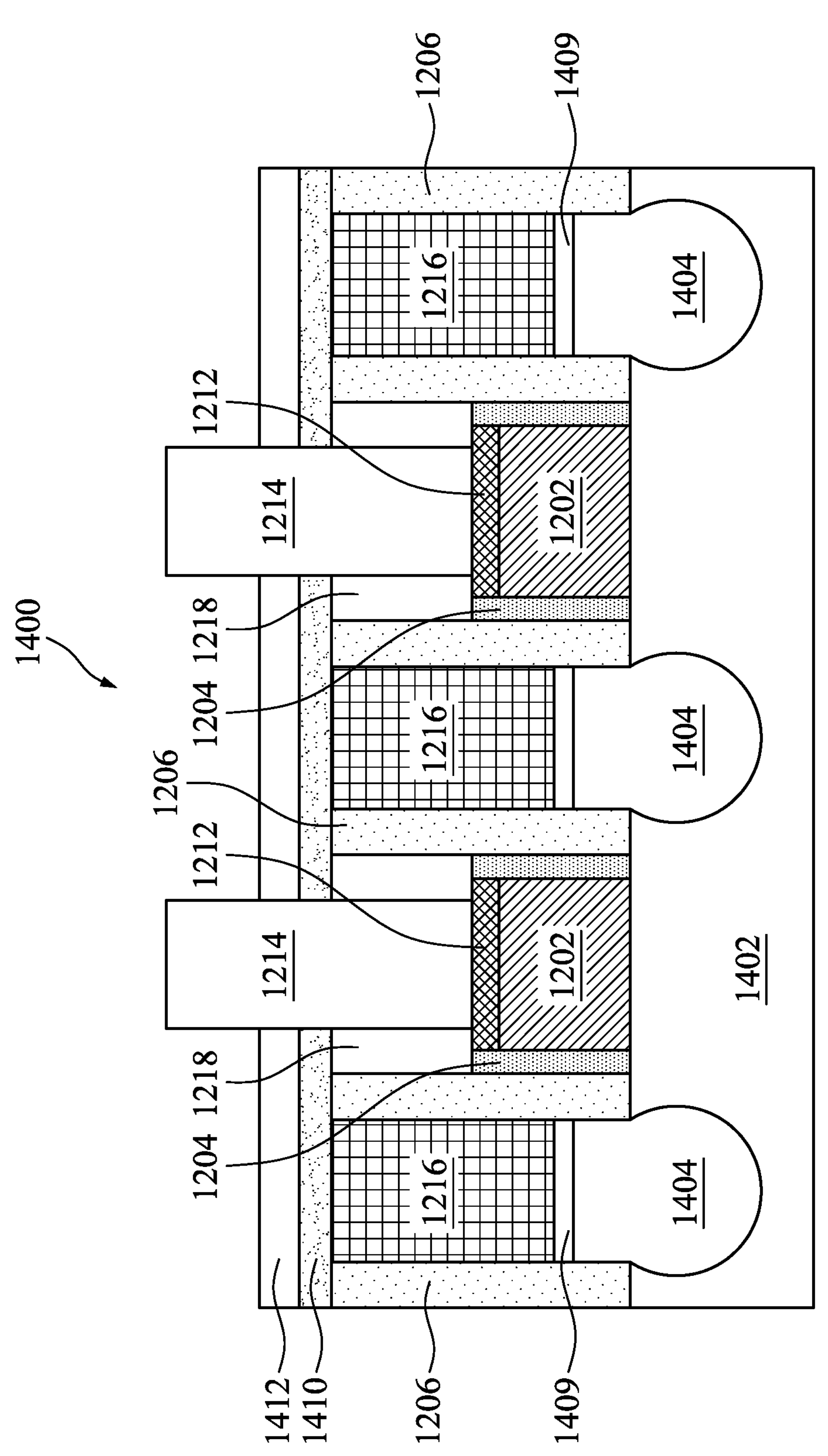

Referring to the example of FIG. 14E, in an embodiment after completion of blocks 1318 and 1320, the area 1400 includes via gate contacts 1214 and source/drain via contacts (not shown).

At block 1322, the example method 1300 includes performing further fabrication operations. A semiconductor device may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1300, and some process steps described above may be replaced or eliminated in accordance with various embodiments of the method 1300.

The described systems, methods, techniques, and articles for an improved Via Gate (VG). The described systems, methods, techniques, and articles can be used with a wide range of semiconductor devices including GAA and FinFET.

A semiconductor device includes: a substrate having a metal gate, gate spacers on sides of the metal gate, an etch stop layer (ESL), and interlayer dielectric (ILD) material over a source/drain region; a tungsten (W) cap formed from W material deposited over the metal gate and between the gate spacers; and a via gate (VG) formed above the W cap.

In certain embodiments of the semiconductor device, the W cap was formed by depositing W material over the substrate and removing unwanted W material to form the W cap.

In certain embodiments of the semiconductor device, the W cap was formed by removing unwanted W material.

In certain embodiments of the semiconductor device, the unwanted W material was removed by removing Tungsten oxide (WOx) formed on sidewalls of the ESL and the gate spacers via wet etching operations using an ammonium solution.

In certain embodiments of the semiconductor device, the Tungsten oxide (WOx) was removed via wet etching operations using NH4OH at a concentration of 1:1 to approximately 1:50 at about 50° to about 70° C.

In certain embodiments of the semiconductor device, the unwanted W material was removed by removing W material from a top of the ESL, sidewalls of the ESL, and sidewalls of the gate spacers via wet etching operations using an ozone solution.

In certain embodiments of the semiconductor device, the ozone solution includes $DIO_3$ with a concentration of 5 to 100 ppm at room temperature.

In certain embodiments of the semiconductor device, the unwanted W material was removed by removing W material from a top of the ESL, sidewalls of the ESL, and sidewalls of the gate spacers via wet etching operations using a mixture including an ozone solution and hydrochloric acid.

In certain embodiments of the semiconductor device, the mixture includes $DIO_3$ with a concentration of 5 to 100 ppm at room temperature and HCl with a concentration of 1:1 to approximately 1:50 at about 25° to about 50° C.

A semiconductor fabrication method includes: receiving a substrate having a metal gate, gate spacers on sides of the metal gate, an etch stop layer (ESL), and interlayer dielectric (ILD) material over a plurality of source/drain regions; depositing tungsten (W) material over the substrate; removing unwanted W material to form a W cap; forming openings in the ILD material over the plurality of source/drain regions; filling conductive material in the openings contacting the source/drain regions to form source/drain contacts; forming a contact etch stop layer (CESL) layer over the source/drain and gate regions; forming an ILD layer over the a CESL layer; forming contact via openings in the CESL and the ILD layer; and forming a via gate (VG) on the W cap through a contact via opening.

In certain embodiments of the semiconductor fabrication method, depositing tungsten (W) material over the substrate includes depositing W material using physical vapor deposition operations at a pressure of about 150 to about 250 mT.

In certain embodiments of the semiconductor fabrication method, removing unwanted W material includes removing Tungsten oxide (WOx) formed on sidewalls of the ESL and the gate spacers via wet etching operations using an ammonium solution.

In certain embodiments of the semiconductor fabrication method, removing unwanted W material includes removing Tungsten oxide (WOx) via wet etching operations using NH4OH at a concentration of 1:1 to approximately 1:50 at about 50° to about 70° C.

In certain embodiments of the semiconductor fabrication method, removing unwanted W material further includes removing W material from a top of the ESL, sidewalls of the ESL, and sidewalls of the gate spacers via wet etching operations using an ozone solution.

In certain embodiments of the semiconductor fabrication method, removing unwanted W material further includes removing W material from a top of the ESL, sidewalls of the ESL, and sidewalls of the gate spacers via wet etching operations using $DIO_3$ with a concentration of 5 to 100 ppm at room temperature.

In certain embodiments of the semiconductor fabrication method, removing unwanted W material further includes removing W material from a top of the ESL, sidewalls of the ESL, and sidewalls of the gate spacers via wet etching operations using a mixture including an ozone solution and hydrochloric acid.

In certain embodiments of the semiconductor fabrication method, the mixture includes $DIO_3$ with a concentration of 5 to 100 ppm at room temperature and HCl with a concentration of 1:1 to approximately 1:50 at about 25° to about 50° C.

Another semiconductor fabrication method includes: receiving a substrate having a metal gate, gate spacers on sides of the metal gate, an etch stop layer (ESL), and interlayer dielectric (ILD) material over a plurality of source/drain regions; depositing tungsten (W) material over the substrate; removing unwanted W material from a top of the ESL, sidewalls of the ESL, and sidewalls of the gate spacers via wet etching operations to form a W cap; forming openings in the ILD material over the plurality of source/drain regions; filling conductive material in the openings contacting the source/drain regions to form source/drain contacts; forming a contact etch stop layer (CESL) layer over the source/drain and gate regions; forming an ILD layer over the a CESL layer; forming contact via openings in the CESL and the ILD layer; and forming a via gate (VG) on the W cap through a contact via opening.

In certain embodiments of the semiconductor fabrication method, removing unwanted W material includes removing W material from a top of the ESL, sidewalls of the ESL, and sidewalls of the gate spacers via wet etching operations using a mixture including an ozone solution and hydrochloric acid mixed in water.

In certain embodiments of the semiconductor fabrication method, the mixture includes $DIO_3$ with a concentration of 5 to 100 ppm at room temperature and HCl with a concentration of 1:1 to approximately 1:50 at about 25° to about 50° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

receiving a substrate having a metal gate, gate spacers on sides of the metal gate, interlayer dielectric (ILD) material over a plurality of source/drain regions, and an etch stop layer (ESL) extending above the gate spacers and disposed between the gate spacers and the ILD material;

depositing tungsten (W) material over the substrate above the metal gate, over a surface of the gate spacers, and along a sidewall of the ESL;

removing a first portion of the W material from the sidewall of the ESL and over the surface of the gate spacers via first wet etching operations using a first solution;

removing, from the sidewall of the ESL and over the surface of the gate spacers, W material remaining after removing the first portion of the W material via second wet etching operations using a second solution that is different from the first solution to form a W cap over the metal gate;

forming openings in the ILD material over the plurality of source/drain regions;

filling conductive material in the openings contacting the plurality of source/drain regions to form source/drain contacts;

forming a contact etch stop layer (CESL) over the plurality of source/drain regions and the W cap;

forming an ILD layer over the CESL;

forming contact via openings in the CESL and the ILD layer; and forming a via gate (VG) on the W cap through a contact via opening.

2. The method of claim 1, wherein depositing tungsten (W) material over the substrate comprises depositing W material using physical vapor deposition operations at a pressure of about 150 to about 250 mT.

3. The method of claim 1, wherein removing the first portion of the W material from the sidewall of the ESL and over the surface of the gate spacers comprises removing the first portion of the W material via wet etching operations using an ammonium solution.

4. The method of claim 3, wherein removing the first portion of the W material comprises removing the first portion of the W material via wet etching operations using $NH_4OH$ at a concentration of 1:1 to approximately 1:50 at about 50° to about 70° C.

5. The method of claim 1, wherein removing the W material remaining after removing the first portion of the W material comprises removing W material from the sidewall of the ESL and over the surface of the gate spacers via wet etching operations using an ozone solution.

6. The method of claim 1, wherein removing the W material remaining after removing the first portion of the W material comprises removing the W material from the sidewall of the ESL and over the surface of the gate spacers via wet etching operations using $DIO_3$ with a concentration of 5 to 100 ppm at room temperature.

7. The method of claim 1, wherein removing the W material remaining after removing the first portion of the W material comprises removing the W material from the sidewall of the ESL and over the surface of the gate spacers via wet etching operations using a mixture comprising an ozone solution and hydrochloric acid.

8. The method of claim 7, wherein the mixture comprises $DIO_3$ with a concentration of 5 to 100 ppm at room temperature and HCl with a concentration of 1:1 to approximately 1:50 at about 25° to about 50° C.

9. A method comprising:

receiving a substrate having a metal gate, gate spacers on sides of the metal gate, interlayer dielectric (ILD) material over a plurality of source/drain regions, and an etch stop layer (ESL) extending above the gate spacers and disposed between the gate spacers and the ILD material;

depositing tungsten (W) material over the substrate above the metal gate, over a surface of the gate spacers, and along a sidewall of the ESL;

removing a first portion of the W material from the sidewall of the ESL and over the surface of the gate spacers using an ammonium solution;

removing, from the sidewall of the ESL and over the surface of the gate spacers, W material remaining after removing the first portion of the W material via wet etching operations using an ozone solution to form a W cap; and forming a via gate (VG) contact on the W cap through a contact etch stop layer (CESL) and an ILD layer formed over the W cap.

10. The method of claim 9, wherein removing the W material remaining after removing the first portion of the W material comprises removing the W material from the sidewall of the ESL and over the surface of the gate spacers via wet etching operations using a mixture comprising the ozone solution and hydrochloric acid mixed in water.

11. The method of claim 10, wherein the mixture comprises $DIO_3$ with a concentration of 5 to 100 ppm at room temperature and HCl with a concentration of 1:1 to approximately 1:50 at about 25° to about 50° C.

12. A method comprising:

receiving a substrate having a metal gate, gate spacers on sides of the metal gate, interlayer dielectric (ILD) material over a plurality of source/drain regions, and an etch stop layer (ESL) extending above the gate spacers and disposed between the gate spacers and the ILD material;

depositing tungsten (W) material over the substrate above the metal gate, over a surface of the gate spacers, and along a sidewall of the ESL;

removing a first portion of the W material from the sidewall of the ESL and over the surface of the gate spacers via 1st wet etching operations;

removing, from the sidewall of the ESL and over the surface of the gate spacers, W material remaining after removing the first portion of the W material via 2nd wet etching operations to form a W cap over the metal gate;

forming a contact via opening in an ILD layer and a contact etch stop layer (CESL) over the W cap; and forming a via gate (VG) on the W cap through the contact via opening.

13. The method of claim 12, wherein removing the first portion of the W material from the sidewall of the ESL and the surface of the gate spacers via the 1st wet etching operations comprises removing the first portion of the W material using an ammonium solution.

14. The method of claim 13, wherein removing the first portion of the W material from the sidewall of the ESL and the surface of the gate spacers via the 1st wet etching operations comprises removing the first portion of the W material using $NH_4OH$ at a concentration of 1:1 to approximately 1:50 at about 50° to about 70° C.

15. The method of claim 12, wherein removing the W material remaining after removing the first portion of the W material via the 2nd wet etching operations comprises removing the W material using an ozone solution.

16. The method of claim 15, wherein removing the W material remaining after removing the first portion of the W material via the 2nd wet etching operations comprises removing the W material using $DIO_3$ with a concentration of 5 to 100 ppm at room temperature.

17. The method of claim 12, wherein removing the W material remaining after removing the first portion of the W material via the 2nd wet etching operations comprises removing the W material using a mixture comprising an ozone solution and hydrochloric acid.

18. The method of claim 17, wherein removing the W material remaining after removing the first portion of the W material via the 2nd wet etching operations comprises removing the W material using a mixture comprising $DIO_3$ with a concentration of 5 to 100 ppm at room temperature and HCl with a concentration of 1:1 to approximately 1:50 at about 25° to about 50° C.

19. The method of claim 12, wherein the metal gate comprises a metal gate for a gate-all-around (GAA) device.

20. The method of claim 12, wherein the W cap is formed over the metal gate with a thickness in a range of about 2 nanometers to about 10 nanometers without residue above the gate spacers.

* * * * *